(12) United States Patent
Uchida et al.

(10) Patent No.: US 7,161,446 B2
(45) Date of Patent: Jan. 9, 2007

(54) NOISE FILTER

(75) Inventors: Katsuyuki Uchida, Hikone (JP); Hidetoshi Yamamoto, Yokohama (JP); Takashi Kodama, Otsu (JP); Kazuhiko Takenaka, Yokaichi (JP); Takehiko Otsuki, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 120 days.

(21) Appl. No.: 11/245,884

(22) Filed: Oct. 7, 2005

(65) Prior Publication Data

US 2006/0028303 A1 Feb. 9, 2006

Related U.S. Application Data

(62) Division of application No. 10/727,957, filed on Dec. 4, 2003.

(30) Foreign Application Priority Data

Jan. 10, 2003 (JP) .............................. 2003-004888
Mar. 28, 2003 (JP) .............................. 2003-091611

(51) Int. Cl.
H03H 7/01 (2006.01)
H01F 27/00 (2006.01)

(52) U.S. Cl. ..................................... 333/185; 333/181
(58) Field of Classification Search ................ 333/12, 333/177, 181, 184, 185; 336/200
See application file for complete search history.

(56) References Cited

U.S. PATENT DOCUMENTS

| | | | | |
|---|---|---|---|---|
| 5,583,470 A | * | 12/1996 | Okubo | ........................ 333/185 |
| 5,668,511 A | | 9/1997 | Furutani et al. | |
| 5,955,931 A | | 9/1999 | Kaneko et al. | |
| 6,133,809 A | | 10/2000 | Tomohiro et al. | |
| 6,806,794 B1 | | 10/2004 | Yamamoto et al. | |
| 2004/0000967 A1 | | 1/2004 | Bodley et al. | |

FOREIGN PATENT DOCUMENTS

| | | |
|---|---|---|
| GB | 2383198 | 6/2003 |
| JP | 06-061056 | 3/1994 |
| JP | 06-275436 | 9/1994 |
| JP | 07-263280 | 10/1995 |
| JP | 08-078218 | 3/1996 |
| JP | 09-069743 | 3/1997 |
| JP | 10-050523 | 2/1998 |
| JP | 11-017483 | 1/1999 |
| JP | 11-273924 | 10/1999 |
| JP | 2000-091125 | 3/2000 |
| JP | 2002-111421 | 4/2002 |
| KR | 2001-21239 | 3/2001 |
| WO | WO 03/001665 | 1/2003 |

OTHER PUBLICATIONS

Official Communication issued by the Chinese Patent Office in the corresponding Chinese Patent Application No. 200410001298.4, Jul. 1, 2005.
Official Communication issued by the Chinese Patent Office in the corresponding Chinese Patent Application No. 200410001298.4, Apr. 15, 2005.
Official Communication dated Nov. 14, 2005, issued in the corresponding Korean Patent Application No. 2004-0001455.

* cited by examiner

*Primary Examiner*—Seungsook Ham
(74) *Attorney, Agent, or Firm*—Keating & Bennett, LLP

(57) ABSTRACT

A noise filter includes a laminate body including magnetic layers, line conductors and ground conductors, with one line conductor and one ground conductor alternately arranged in interfaces between the magnetic layers. With an electrical signal applied to the line conductors with the ground conductors grounded, a high-frequency noise is attenuated using a magnetic loss of the magnetic layer.

6 Claims, 28 Drawing Sheets

100

110 ns the known noise filter 100 has the following drawbacks.
NOISE FILTER

This application is a Divisional Application of U.S. patent application Ser. No. 10/727,957 filed Dec. 4, 2003, currently pending.

BACKGROUND OF THE INVENTION

1. Field of the Invention

The present invention relates to noise filters for controlling electromagnetic interference and, in particular, to a noise filter that attenuates noise by absorbing high-frequency elements.

2. Description of the Related Art

FIG. 26 illustrates a known noise filter 100. The noise filter 100 includes a metal line 101, electrodes 102 connected to both ends of the metal line 101, and a case 103. The electrodes 102 are covered with the case 103. The case 103 is made of a ferrite resin that is a mixture of sintered ferrite powder, which is a magnetic powder, and a resin. The sintered ferrite is not limited to the frequency limit line of a magnetic loss $\mu''$ of a complex permeability represented by $\mu'$-$j\mu''$.

The noise removal range of the noise filter 100 effectively extends into the range of several GHz above 1 GHz. Attenuation in the high-frequency range is expected (Japanese Unexamined Patent Application Publication No. 2000-91125, FIG. 1).

FIG. 27 illustrates another known noise filter 110. An internal conductor 112 is coaxially arranged in and penetrates through a metal cylinder 111 as a cylindrical external conductor. The spacing defined by the metal cylinder 111 and the internal conductor 112 is filled with a composite magnetic material 114 including an Si—Fe based magnetic powder as the major component.

The Si—Fe based magnetic powder as the main component of the composite magnetic material 114 is scaly and has a complex specific permeability of $\mu r'$-$j\mu r''$ and a complex specific dielectric constant $\epsilon r'$-$j\epsilon r''$.

The noise filter 110, which is a distributed parameter circuit, does not experience the degradation in insertion attenuation characteristics in GHz bands that a noise filter as a lumped parameter circuit typically suffers from due to resonance. The composite magnetic material 114 including the Si—Fe based magnetic powder maintains $\mu r'$ in a high frequency range. Along with this, a peak of the $\mu r''$ is shifted toward a high frequency region. As a result, the insertion loss characteristic is maintained at a satisfactory level from a MHz band to a GHz band. Reference is made to Japanese Unexamined Patent Application Publication No. 11-273924 (FIG. 1).

FIG. 28 illustrates another known noise filter 120. The noise filter 120 is a low-pass filter that reliably absorbs a high-frequency element in high frequency regions. The noise filter 120 includes a ground electrode 121, a signal line electrode 122, and an insulating base 123. The ground electrode 121 and the signal line electrode 122 are arranged on the insulating base 123. The insulating base 123 is a composite material, including a mixture of a ferromagnetic metal powder and an insulating resin.

The insulating base 123 absorbs unwanted high-frequency elements in a high-frequency range included in a signal conducted by the signal line electrode 122. Reference is made to Japanese Unexamined Patent Application Publication No. 8-78218.

The known noise filter 100 has the following drawbacks. With the case 103 made of a magnetic material surrounding the metal line 101, the noise filter 100 functions as an impedance element with the metal line 101 having an inductance response to the permeability of the case 103. The noise filter 100, connected in series with a transmission line such as a printed circuit board, causes an impedance mismatch, thereby reflecting and thus controlling noise. The complex permeability $\mu'$-$j\mu''$ of the magnetic material forming the case 103 contributes to the impedance of the noise filter 100. Noise controlling is achieved in a frequency range where a magnetic loss $\mu''$ does not occur. In other words, since insertion loss occurs in a low-frequency range, low-frequency passband characteristics are adversely affected.

The noise filters 110 and 120 suffer from the following drawbacks. The noise filters 110 and 120 include a magnetic powder in the composite magnetic material 114 and the insulating base 123. Therefore, the magnetic loss $\mu''$ does not sharply increase, the insertion loss characteristics do not sharply increase, and a large attenuation is not achieved in a frequency range above a certain frequency.

SUMMARY OF THE INVENTION

To overcome the problems described above, preferred embodiments of the present invention provide a noise filter having excellent low-frequency passband characteristics, and provide a noise filter that has sharply rising insertion loss characteristics and provides a large attenuation above a certain frequency.

In a preferred embodiment of the present invention, a noise filter includes a laminate body including magnetic layers, line conductors, and ground conductors wherein one of the line conductors and the ground conductors is disposed in each of the interfaces between the magnetic layers such that one line conductor alternates with one ground conductor in lamination, and one ground conductor is arranged on the top magnetic layer, and another ground conductor is arranged on the bottom magnetic layer. The magnetic layer is made of a magnetic oxide, and produces no or very little attenuation of an electrical signal within a frequency range below a frequency at which a magnetic loss occurs and attenuates an electrical signal within a frequency range where the magnetic loss occurs.

The noise filter provides a magnetic loss $\mu''$ that sharply rises with frequency, and greatly attenuates the electrical signal at a frequency at which the magnetic loss rises. The noise filter does not attenuate the electrical signal within a frequency range below the frequency at which the magnetic loss occurs, but attenuates the electrical signal within a frequency range where the magnetic loss occurs. An excellent low-frequency passband is thus achieved.

The noise filters according to preferred embodiments of the present invention are now described below.

In a first preferred embodiment of the present invention, a noise filter includes a laminate body including magnetic layers, line conductors, and ground conductors wherein one of the line conductors and the ground conductors is disposed in each of the interfaces between the magnetic layers such that one line conductor alternates with one ground conductor in lamination, and one ground conductor is arranged on the top magnetic layer and another ground conductor is arranged on the bottom magnetic layer. The line conductors disposed between the magnetic layers are serially connected. The magnetic layer is preferably made of a magnetic oxide, and the frequency at which the magnetic loss of the magnetic oxide exceeds 1 is preferably equal to or greater than about 80 MHz. The magnetic layer causes no or very little attenuation of an electrical signal within a frequency range below a frequency at which a magnetic loss occurs and attenuates an electrical signal within a frequency range where the magnetic loss occurs.

In the noise filter according to the first preferred embodiment of the present invention, the ground conductor is disposed on each of the top magnetic layer and the bottom magnetic layer, and the line conductor and the ground conductor are alternately disposed in interfaces between the magnetic layers. In this arrangement, the ground conductor overlaps the entire length of the line conductor sandwiched between the magnetic layers. This arrangement confines an electrical signal traveling along the line conductor on each layer between the ground conductors, thereby preventing the signal from being attenuated in the passband of the filter. With the ground conductors arranged on the top and bottom magnetic layers, the noise filter prevents noise from entering into the line conductor from the outside, thereby reliably conducting the electrical signal. If the thickness of all of the magnetic layers are approximately equal to each other and the width of all of the line conductors are approximately equal to each other, characteristic impedances of all of the line conductors are substantially equal to each other. Since the characteristic impedances of the line conductors connected in series have an approximately constant characteristic impedance, noise is not reflected in the middle of the conductor lines. This arrangement controls resonance of noise and facilitates impedance matching with an external circuit. When the line conductors interposed between the magnetic layers are serially connected, the overall length of a line path is increased, which increases attenuation of noise conducted by the conductor line.

In the first preferred embodiment, the line conductor preferably has a meandering shape. Alternatively, the line conductor may have a spiral shape. The line conductors, disposed between the laminated magnetic layers, define a coil around a center axis aligned in the direction of lamination of the magnetic layers. The line conductor having a meandering shape or a spiral shape provides a length that is greater than the length of the straight-line conductor, which thereby increases attenuation of noise. Although a coiled conductor increases the overall thickness of the noise filter, the area of the bottom surface of the noise filter is approximately equal to the area of an aperture of the coil. The noise filter is thus provided in a small mounting area. In comparison with the straight-line conductor, the coiled conductor provides an increased length. The attenuation of noise is increased accordingly.

In a second preferred embodiment of the present invention, a noise filter includes a laminate body including magnetic layers. Each of the top magnetic layer and the bottom magnetic layer thereof includes a ground conductor. A line conductor and a ground conductor are alternately disposed in interfaces between the magnetic layers. Ends of the line conductors disposed between the magnetic layers are connected to different signal input electrodes, and the other ends of the line conductors are connected to different signal output electrodes. The magnetic layer is preferably made of a magnetic oxide, and the frequency at which the magnetic loss rises above 1 is equal to or greater than about 80 MHz. The magnetic layer causes no or very little attenuation of an electrical signal within a frequency range below a frequency at which a magnetic loss occurs and attenuates an electrical signal within a frequency range where the magnetic loss occurs.

The noise filter according to the second preferred embodiment of the present invention enables each of the line conductors to function as a low-pass filter, which, together define a noise filter array. A plurality of line conductors individually function as independent low-pass filters, and do not include an impedance mismatch in the middle of the line conductors. In this arrangement, noise is not reflected in the middle of the conductor line. This arrangement controls resonance of noise and facilitates impedance matching with an external circuit.

In a third preferred embodiment of the present invention, the line conductors disposed between the magnetic layers have different characteristic impedances.

The noise filter is thus impedance matched with a wiring having a plurality of characteristic impedance types. By connecting some or all of line conductors in parallel, the number of characteristic impedance types is increased. This arrangement increases the number of types of wirings with which the noise filter is matched.

In a fourth preferred embodiment of the present invention, the noise filter further includes dielectric layers having the ground conductor sandwiched therebetween and magnetic layers having the line conductor sandwiched therebetween.

The characteristic impedance of the noise filter is adjusted, without changing the structure thereof. A resulting desired characteristic impedance matching with a line of a circuit board minimizes the effect of signal reflection. Since an insulating withstand voltage between the line conductor and the ground conductor is increased, the thickness of the layer between the line conductor and the ground conductor is reduced, which reduces the size of the noise filter.

In accordance with a fifth preferred embodiment of the present invention, a noise filter includes a magnetic body and at least two line conductors running alongside each other with a spacing maintained therebetween on a major surface of the magnetic body. The magnetic layer is preferably made of a magnetic oxide, and the frequency at which the magnetic loss of the magnetic oxide increases above 1 is equal to or greater than 80 MHz. The magnetic layer causes no or little attenuation on an electrical signal within a frequency range below a frequency at which a magnetic loss develops and attenuates an electrical signal within a frequency range where the magnetic loss develops.

The noise filter does not attenuate the electrical signal within a frequency range below the frequency at which the magnetic loss develops, but attenuates the electrical signal within a frequency range where the magnetic loss develops. An excellent low-frequency passband is achieved.

In accordance with a sixth preferred embodiment of the present invention, a noise filter includes a magnetic body and at least a pair of line conductors facing each other on major surfaces of the magnetic body such that the line conductors sandwich the magnetic body. The magnetic layer is preferably made of a magnetic oxide, and the frequency at which the magnetic loss of the magnetic oxide rises above 1 is equal to or above 80 MHz. The magnetic layer causes no or little attenuation on an electrical signal within a frequency range below a frequency at which a magnetic loss develops and attenuates an electrical signal within a frequency range where the magnetic loss develops.

The noise filter does not attenuate the electrical signal within a frequency range below the frequency at which the magnetic loss occurs, but attenuates the electrical signal within a frequency range where the magnetic loss occurs. An excellent low-frequency passband is achieved.

The magnetic body preferably includes a hole, which is filled with one of glass, a resin, and a mixture of glass and a resin. In this arrangement, without changing the characteristic impedance, the frequency of the rising edge of the magnetic loss is adjusted by adjusting apparent permeability and dielectric constant of the magnetic layer.

In each of the above-referenced preferred embodiments, ends of the line conductors are connected to different signal input electrodes and the other ends of the line conductors are connected to different signal output electrodes.

The above and other elements, characteristics, features, steps and advantages of the present invention will become clear from the following description of preferred embodiments taken in conjunction with the accompanying drawings.

DETAILED DESCRIPTION OF PREFERRED EMBODIMENTS

The noise filter according to preferred embodiments of the present invention will now be described in detail.

Figure 1:
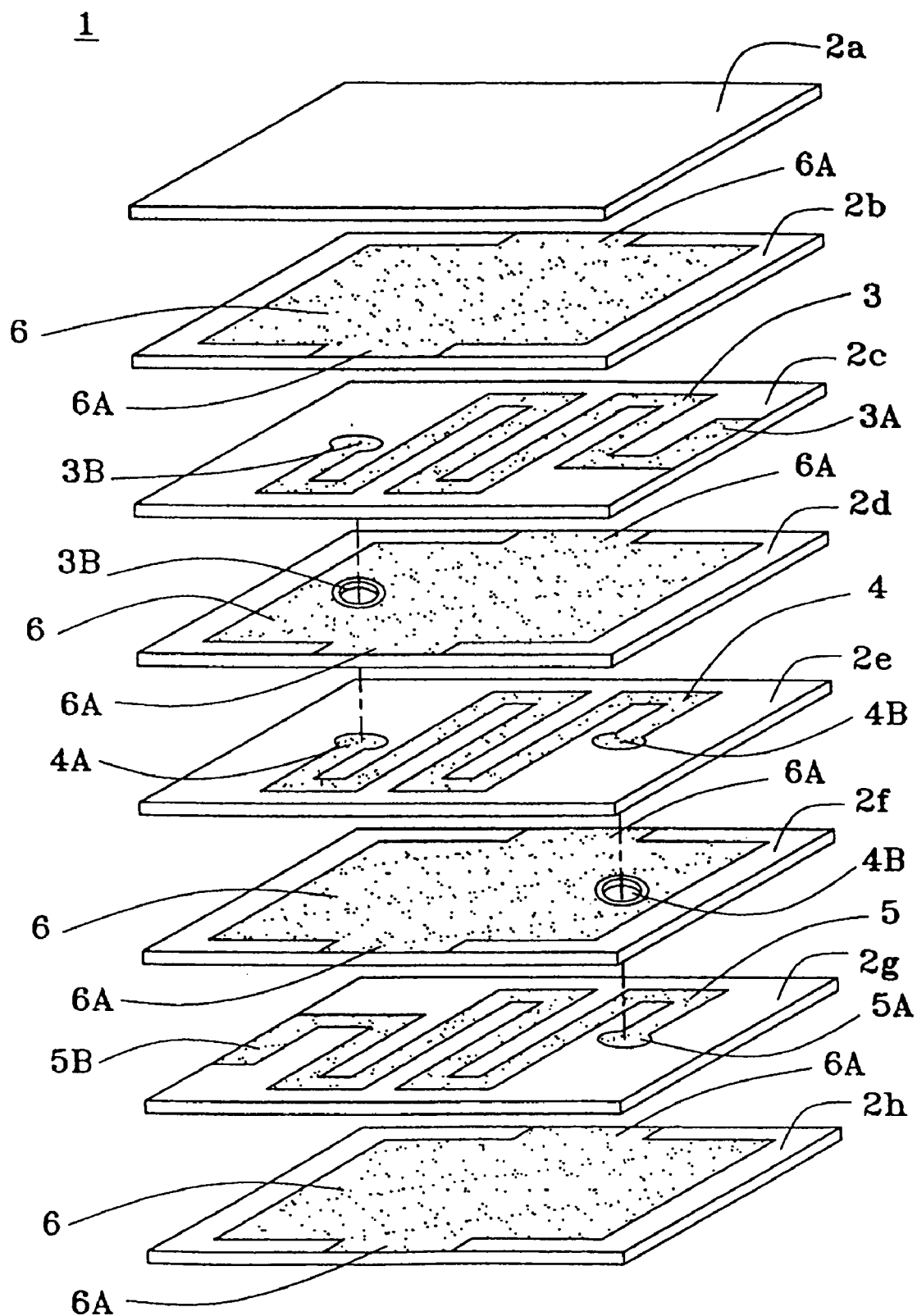
FIG. 1 is an exploded perspective view of a noise filter in accordance with a first preferred embodiment of the present invention.
Figure 2:
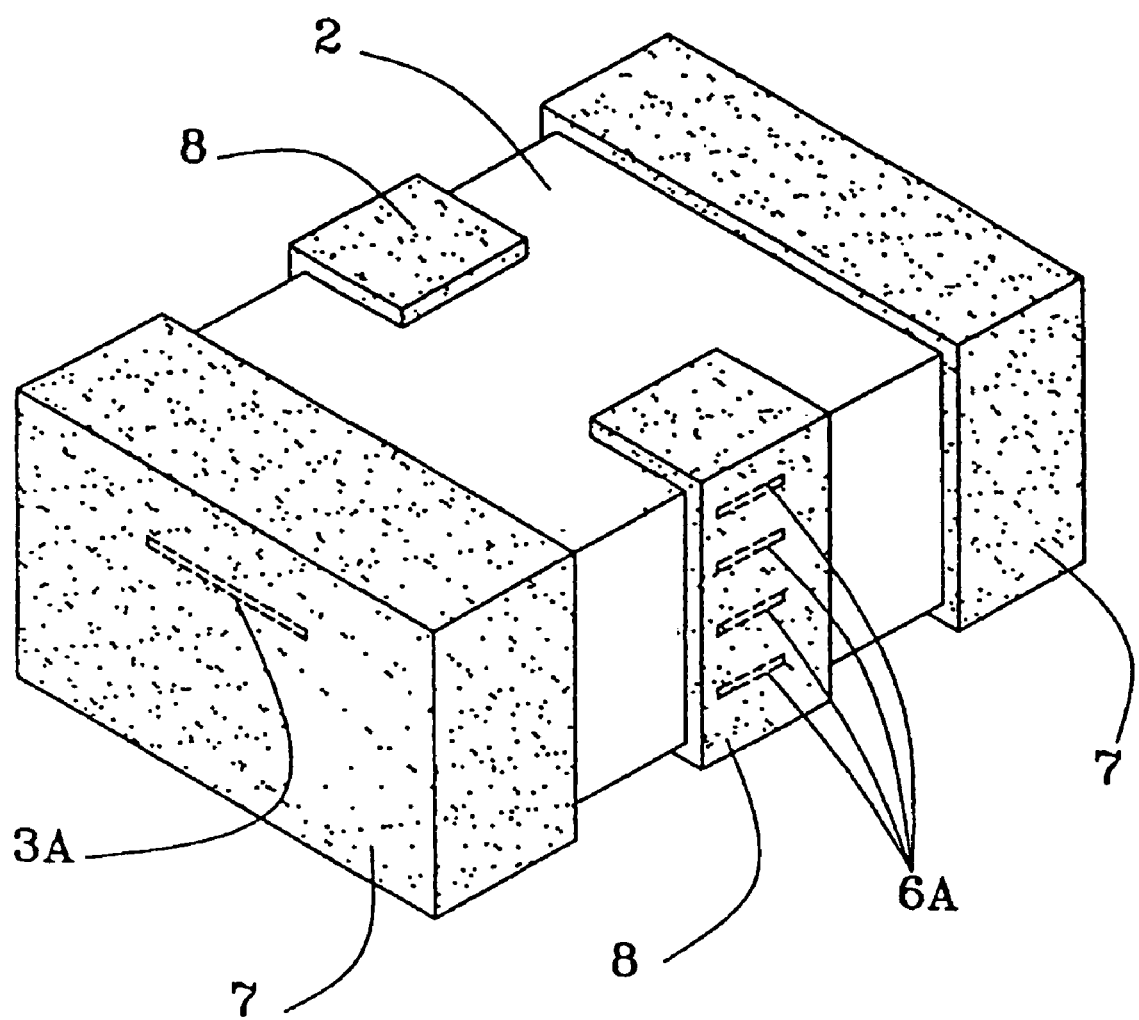
FIG. 2 is a perspective view of the noise filter of the first preferred embodiment of the present invention.

FIGS. 1 and 2 illustrate a noise filter 1 according to a first preferred embodiment of the present invention. The noise filter 1 includes magnetic layers 2a–2h, line conductors 3–5, ground conductors 6, signal electrodes 7, and ground electrodes 8.

A prism-like laminate body 2 defining the external outline of the noise filter 1 preferably includes eight magnetic layers 2a–2h. The laminate body 2 is manufactured by laminating and pressing substantially rectangular green sheets of a magnetic oxide material, and then by sintering the laminate.

The line conductors 3–5 are sandwiched between magnetic layers 2b and 2c, between magnetic layers 2d and 2e, and between magnetic layers 2f and 2g, respectively. The band-like line conductors 3–5, made of an electrically conductive material such as silver paste or palladium, meander on the surface of the magnetic layers 2a–2h in the length direction thereof.

The line conductor 3 between the magnetic layers 2b and 2c includes, on one end thereof, an electrode portion 3A extending to longitudinal edges of the magnetic layers 2b and 2c. Arranged on the other end of the line conductor 3 is a via hole 3B that penetrates through the magnetic layers 2c and 2d. The line conductor 4 between the magnetic layers 2d and 2e includes, on one end thereof, a junction portion 4A that is connected to the line conductor 3 through the via hole 3B, and has, on the other end thereof, a via hole 4B that penetrates through the magnetic layers 2e and 2f. The line conductor 5 between the magnetic layers 2f and 2g includes, on one end thereof, a junction portion 5A that is connected to the line conductor 4 through the via hole 4B. The line conductor 5 includes, on the other end thereof, an electrode portion 5B that extends to longitudinal edges of the magnetic layers 2a–2h. The via holes 3B and 4B are filled with an electrically conductive material such as a silver paste or palladium to serially connect the line conductors 3–5. The electrode portions 3A and 5B are respectively connected to the signal electrodes 7. The line conductors 3–5 meander along the width direction of the magnetic layers 2a–2h, although such line conductors 3–5 are not shown.

The ground conductors 6 are interposed between the magnetic layers 2a–2h so that the ground conductors 6 sandwich the line conductors 3–5. More specifically, the ground conductors 6 are arranged on the top layer 2b and the bottom layer 2g, and the ground conductor 6 and the line conductors 3–5 are alternately arranged in the interfaces between the magnetic layers 2b through 2g.

The ground conductors 6, which are generally rectangular and planar and are made of an electrically conductive material such as a silver paste or palladium, extend over substantially the entire surface of the magnetic layers 2b–2g. Each of the ground conductors 6 has tongue-like electrode portions 6A that extend in the width direction to both sides from the central portion in the length direction of the magnetic layers 2b and 2c. The electrode portions 6A are connected to the ground electrodes 8.

The signal electrodes 7 are respectively arranged on the two longitudinal end surfaces of the laminate body 2. The signal electrodes 7 are arranged to cap the two longitudinal ends of the laminate body 2 such that the signal electrodes 7 cover not only the longitudinal end surfaces, but also part of the top surface, the bottom surface and sidewalls of the laminate body 2. The signal electrodes 7 are manufactured by applying an electrically conductive material on the two ends of the laminate body 2, and baking the electrically conductive material. The signal electrodes 7 are respectively connected to the electrode portions 3A and 5B of the line conductors 3 and 5.

The ground electrodes 8 are arranged to cover part of the sidewalls of the laminate body 2 in the central portion of the laminate body 2. The ground electrodes 8, having a substantially U-shape in cross section, extend in a band along the sidewall in the direction of thickness of the laminate body 2 and partially cover the top and bottom surfaces of the laminate body 2. The ground electrodes 8 are manufactured by applying an electrically conductive material on the sidewalls of the laminate body 2 and baking the electrically conductive material. The ground electrodes 8 are respectively connected to the electrode portions 6A.

The operation of the noise filter 1 will now be described.

The noise filter 1 is mounted on a circuit board having signal conducting lines thereon. The signal electrodes 7 are connected to the lines on the circuit board, and the ground electrodes 8 are connected to a ground terminal of the circuit board. A signal is transferred through the line conductors 3–5 while the ground conductors 6 are maintained at a ground potential.

The magnetic oxide material forming the magnetic layers 2a–2h develops a magnetic loss $\mu''$ as the frequency of a signal passing through the line conductors 3–5 increases. The noise filter 1 controls noise due to an absorption characteristic thereof resulting from the magnetic loss, thereby defining a low-pass filter.

The noise filter 1 provides a substantially constant permeability within a frequency range where no magnetic loss occurs. The dielectric constant of the noise filter 1 remains almost constant regardless of frequency changes. Inductance and capacitance are substantially uniformly distributed along the line of the noise filter 1. Such a line defines a distributed parameter circuit and has a characteristic impedance represented by $Zo=\sqrt{(\Delta L/\Delta C)}$. If the characteristic impedance of the noise filter 1 matches the characteristic impedance of a circuit board on which the noise filter 1 is mounted, no reflection is caused, and the effect of reflection on the waveform of a signal is effectively controlled.

The noise control of the noise filter 1 is pronounced at a frequency where the magnetic loss increases. The magnetic loss depends on an attenuation coefficient $\alpha$ of a propagation constant $\gamma=\alpha+j\beta$ of a transmission line. The use of the magnetic oxide achieves an insertion loss characteristic that sharply increases with frequency. To achieve even sharper insertion loss, the frequency at which the magnetic loss increases above 1 is preferably set to be at least about 80 MHz.

A manufacturing method of the magnetic layers 2a–2h is described below. An $Fe_2O_3$ powder, a ZnO powder, an NiO powder, a CuO powder, and a $Co_3O_4$ powder are preferably prepared as starting materials.

Figure 3:
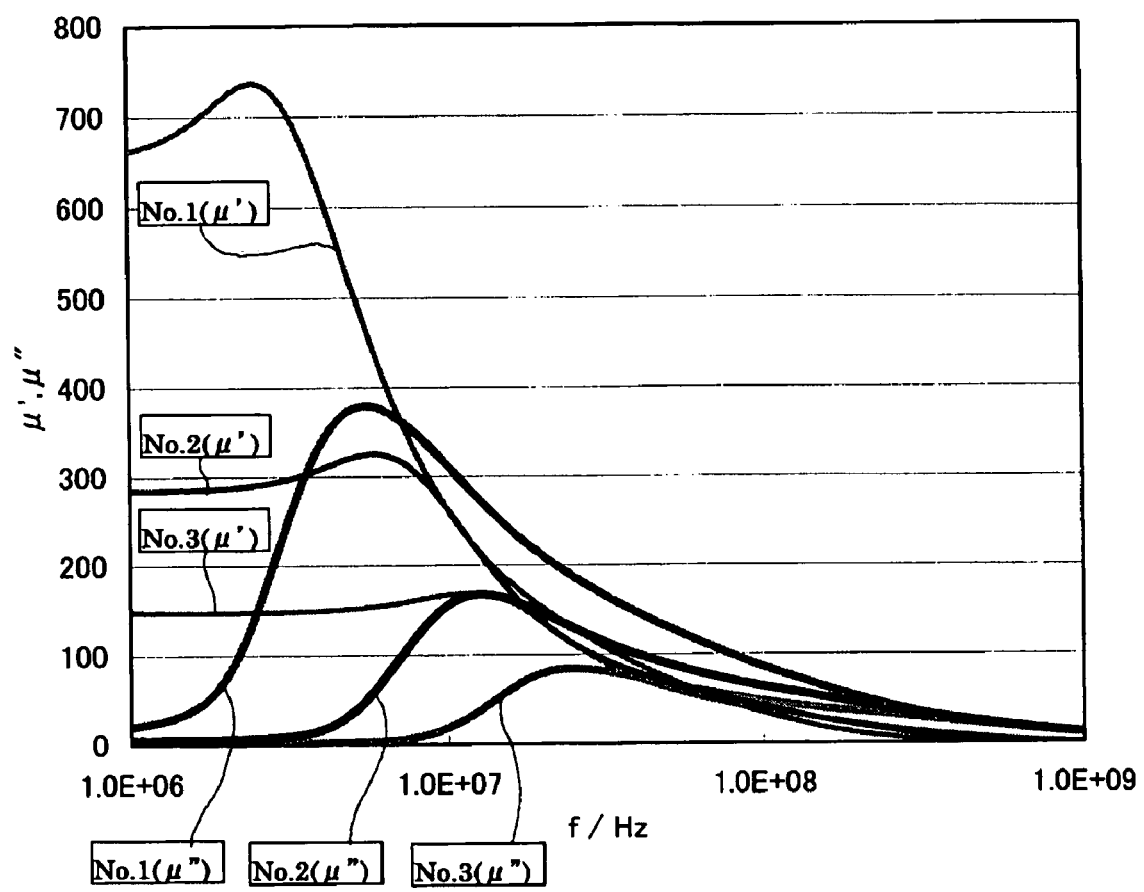
FIG. 3 is a graph plotting results of measurement of frequency dependency of μ' and μ" of samples Nos. 1–3.
Figure 4:
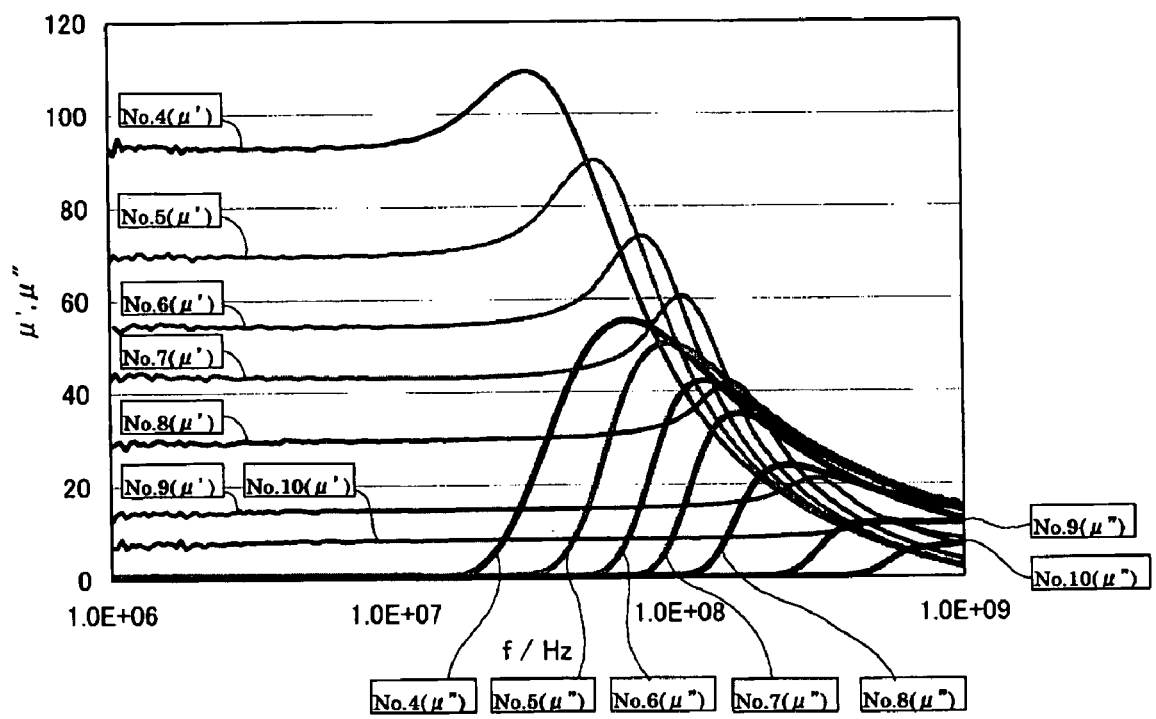
FIG. 4 is a graph plotting results of measurement of frequency dependency of μ' and μ" of samples Nos. 4–10.

Sample Nos. 1–10 having compositions as listed in Table are prepared by weighing the $Fe_2O_3$ powder, the ZnO powder, the NiO powder, the CuO powder, and the $Co_3O_4$ powder. The weighed powders are mixed. The mixture is introduced together with an amount of deionized water that is about 0.5 to about 1.5 times heavier than the mixture and a dispersant of about 0.5 to about 2.5 weight percent into a ball mill holding PSZ balls of about 50 volume percent, each ball having 1 mm diameter. The mixture is ball-milled for about 20 hours. The PSZ balls may wear, and about 0.02 to about 0.2 weight percent of $ZrO_2$ and about 0.0006 to about 0.006 weight percent of $Y_2O_3$ may be included in the mixture. This amount presents no particular problems in noise filter characteristics. A slurry of the mixture is spray-dried at a temperature within a range of about 150–250° C., and then loaded into a box. The dried slurry is pre-sintered at a temperature of about 700° C. for about two hours. During the pre-sintering operation, a temperature rising rate during pre-sintering is about 200° C./h, and a temperature falling rate is about 200° C./h from about 700° C. to about 500° C. Below about 500° C., the mixture is left to naturally cool down. A resulting pre-sintered powder as a starting material is introduced together with an amount of deionized water that is about 0.5 to about 1.5 times heavier than the pre-sintered powder and a dispersant of about 1.0–3.0 weight percent into a ball mill holding PSZ balls of about 50 volume percent, each ball having a diameter of about 1 mm. The powder is ball-milled for about 48 hours. The PSZ balls may wear, and about 0.05–0.5 weight percent of $ZrO_2$ and about 0.0015–0.015 weight percent of $Y_2O_3$ may be included in the power. This amount of inclusion presents no particular problem in noise filter characteristics. An acrylic resin binder is mixed with the slurry subsequent to the milling. The slurry is then dried, granulated, and then introduced into a hydraulic press having a molding pressure of about 1700 kg/cm² to form a toroidal ring having a diameter of about 20 mm, an inner diameter of about 10 mm and a height of about 2 mm. The toroidal ring is then sintered in an atmosphere in a temperature profile having a peak temperature of about 900° C. Thus, test samples are produced. The test samples have been measured using an impedance analyzer (Agilent Technology 4291A) in terms of frequency dependency of $\mu'$ and $\mu''$. FIGS. 3 and 4 plot measurement results.

TABLE 1

| Sample No. | Composition | | | | | Frequency at rise of $\mu''$ MHz |
|---|---|---|---|---|---|---|
| | $Fe_2O_3$ | ZnO | NiO | CuO | $Co_3O_4$ | |
| | mol % | | | | wt % | |
| 1 | 48.0 | 29.0 | 14.5 | 8.5 | 0 | 1.2 |
| 2 | 48.0 | 27.5 | 16.0 | 8.5 | 0 | 7.4 |
| 3 | 48.0 | 26.0 | 17.5 | 8.5 | 0 | 8.0 |
| 4 | 48.0 | 25.0 | 18.5 | 8.5 | 0 | 18.0 |
| 5 | 48.0 | 10.0 | 33.5 | 8.5 | 0 | 31.7 |
| 6 | 48.0 | 5.0 | 38.5 | 8.5 | 0 | 53.5 |
| 7 | 48.0 | 1.0 | 42.5 | 8.5 | 0 | 83.3 |
| 8 | 48.0 | 25.0 | 18.5 | 8.5 | 2.0 | 117.2 |
| 9 | 48.0 | 25.0 | 18.5 | 8.5 | 3.0 | 247.9 |
| 10 | 48.0 | 25.0 | 18.5 | 8.5 | 5.0 | 469.1 |

A manufacturing method of the noise filter 1 shown in FIGS. 1 and 2 will now be described.

The pre-sintered powder produced as described above is introduced together with an amount of deionized water that is about 0.3 to about 1.0 times heavier than the pre-sintered powder and a dispersant of about 0.5 to about 3.5 weight percent into a ball mill holding PSZ balls of about 50 volume percent, each ball having a diameter of about 1 mm. The powder is ball-milled for about 48 hours. An acrylic binder, a plasticiser, and an antifoaming agent are added to the powder and then further mixed for about 12 hours. A resulting slurry is deposited on a PET film to form a band-like sheet having a thickness of about 10 μm to about 150 μm (for example, about 100 μm) using a doctor blade. The sheet on the PET film is then dried by electric heaters in a drying chamber. The drying temperature is reduced to within a range of about 40° C. to about 100° C., and a fan is used to blow the air. Preferably the air is heated. Subsequent to the drying operation, the band-like sheet is punched into a square sheet having dimensions of about 100 mm by about 100 mm. A predetermined number of sheets are then subjected to a screen printing operation to form a meandering conductor pattern and a ground electrode pattern with a silver paste. The three meandering conductor patterns are laminated such that each meandering conductor pattern is sandwiched between the ground electrodes. The meandering conductor patterns are connected in series through the via holes. A desired number of external layer sheets are then laminated. A resulting sheet block is wrapped in rubber sheets, and is press bonded under a pressure of about 1000 kg/cm$^2$ in a hydrostatic press. The number of external sheets is adjusted such that the thickness of the block is about 1.5 mm. The laminated and bonded block is then cut to a size of about 4.0 mm (length)×about 2.0 mm (width)×about 1.5 mm (thickness). These blocks are then sintered at a temperature profile having a peak temperature of about 900° C. The sintering operation is typically performed in an atmosphere, however, an excellent sintered block may be obtained in an atmosphere with an oxygen partial pressure of about 19 volume percent.

Subsequent to the sintering operation, the element size is about 3.2 mm (length)×about 1.6 mm (width)×about 1.2 mm (thickness), and the length of the meandering conductor is about 20 mm. After the sintering operation, an external electrode is arranged on a chip end to be connected to the meandering conductor, and a ground external electrode is arranged on the chip sidewall to be connected to the ground electrode.

In the first preferred embodiment, the conductor pattern is printed on each of the sheets. However, to achieve a desired layer thickness, a plurality of sheets having no printed conductor patterns may be laminated. The magnetic layer may be formed using a printing method in which a screen printing operation is repeated until a magnetic layer having a desired thickness is obtained.

Figure 5:
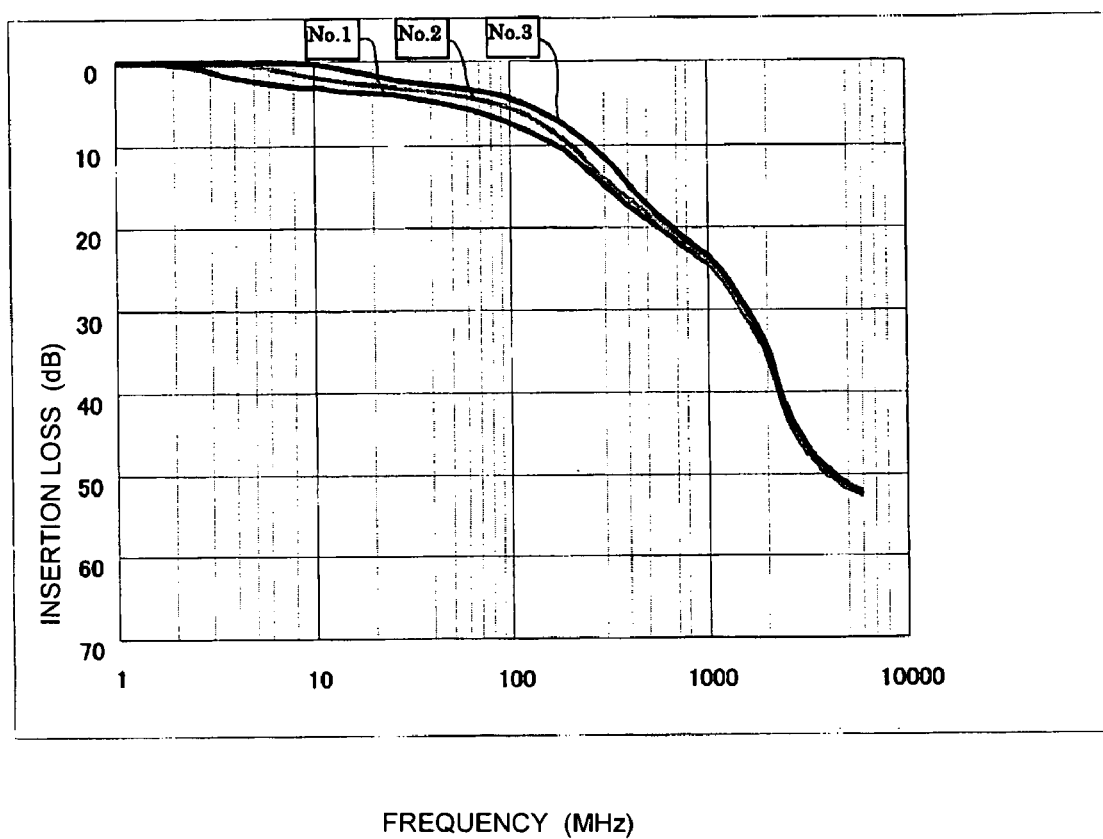
FIG. 5 is a graph plotting insertion loss versus frequency characteristics of sample No. 1–3.
Figure 6:
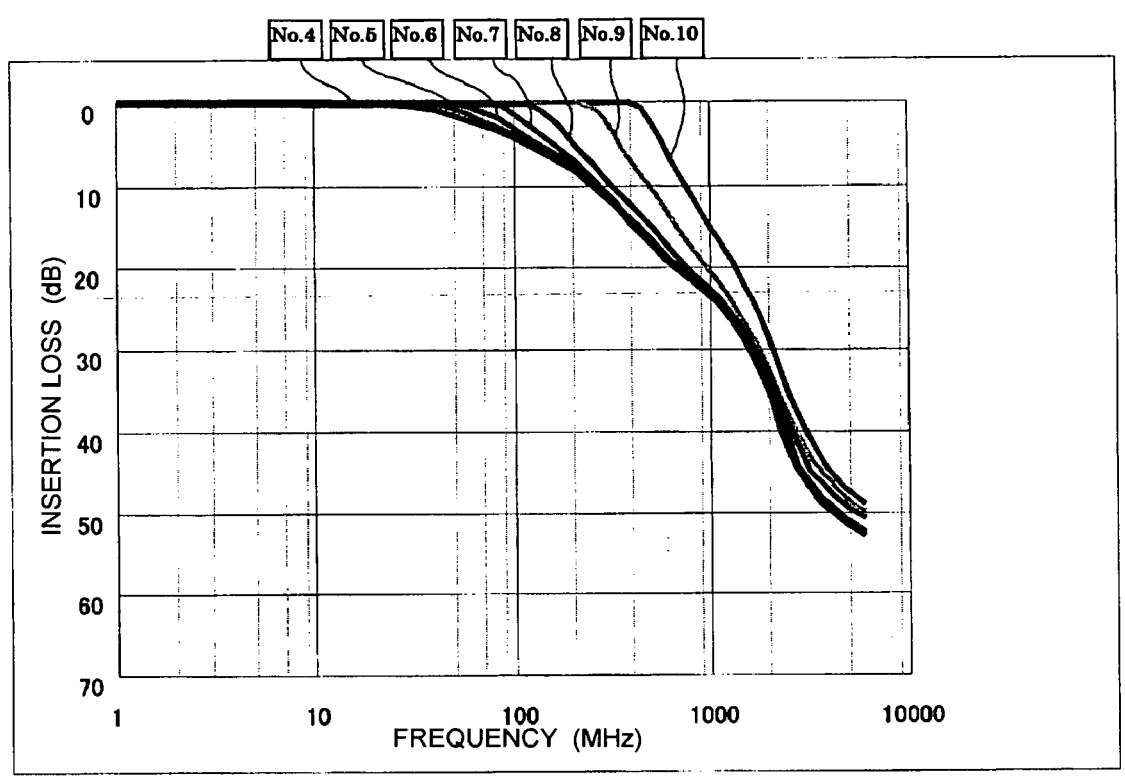
FIG. 6 is a graph plotting insertion loss versus frequency characteristics of sample No. 4–10.

A completed test sample was connected to a network analyzer (Agilent Technology 8753D) to measure insertion loss characteristics. The results of the measurements are shown in FIGS. 5 and 6. FIGS. 5 and 6 show that as the frequency at which the magnetic loss μ" increases, the insertion loss characteristics become steep. Test samples have been produced with the layer thickness between the meandering conductor pattern and the ground electrode changed such that the characteristic impedances of test samples No. 1, No. 2, No. 3, and Nos. 4–10 at the frequency where the magnetic loss begins to increase (within a frequency range where μ' is a substantially constant value) are about 190Ω, 130Ω, 90Ω, and 50Ω, respectively.

Test samples Nos. 4–10 provide excellent insertion loss characteristics if the magnetic loss increases at a frequency of at least about 80 MHz.

The insertion loss characteristics of the test samples are compared with those of a comparative sample as an impedance element. The comparative sample (comparative example 1) is manufactured using the same materials as test sample No. 7 and is identical in structure to test sample No. 7 except that sheets having no ground electrodes are laminated. In other words, the comparative sample includes meandering conductor patterns only in the chip.

Figure 7:
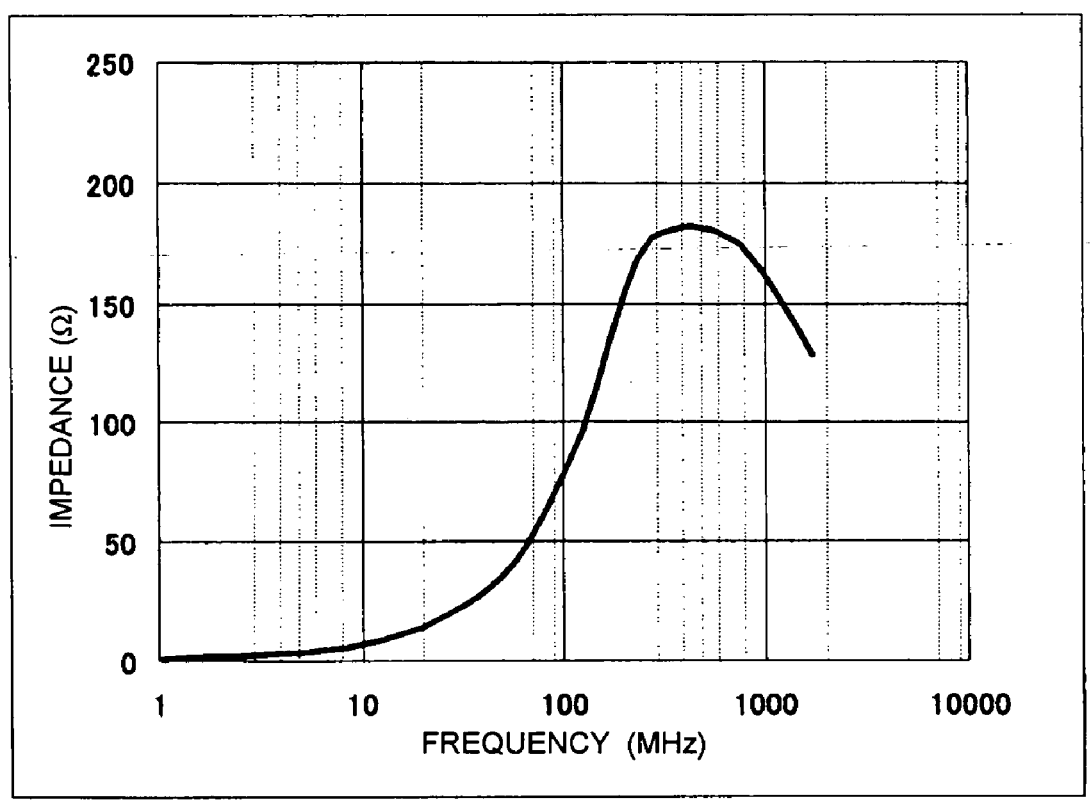
FIG. 7 is a graph plotting impedance versus frequency characteristics.
Figure 8:
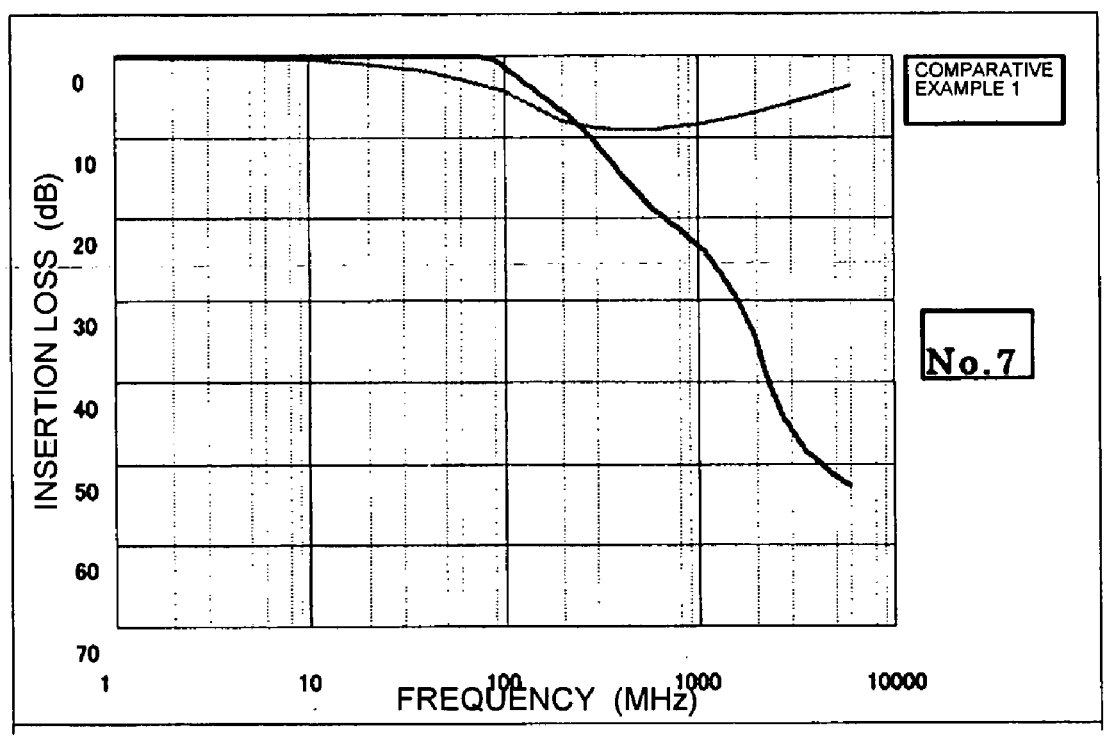
FIG. 8 is a graph plotting insertion loss versus frequency characteristics.

FIG. 7 illustrates the impedance versus frequency characteristics of this element. FIG. 8 plots the insertion losses of test sample No. 7 and the comparative example 1 in comparison.

Although being made of the same magnetic materials, the comparative example 1 suffers from insertion loss in a frequency range where μ" does not occur. Above about 500 MHz, impedance drops due to stray capacitance between terminal electrodes and the insertion loss also drops. In test sample No. 7, insertion loss occurs from the frequency where μ" increases and the effect of insertion loss is maintained at high frequencies in the GHz range.

The first preferred embodiment preferably uses an Ni—Cu—Zn based sintered ferrite. Alternatively, one of an Mg—Cu—Zn based ferrite, an Ni—Mg—Cu—Zn based ferrite, and a Cu—Zn based ferrite may be used.

Figure 9:
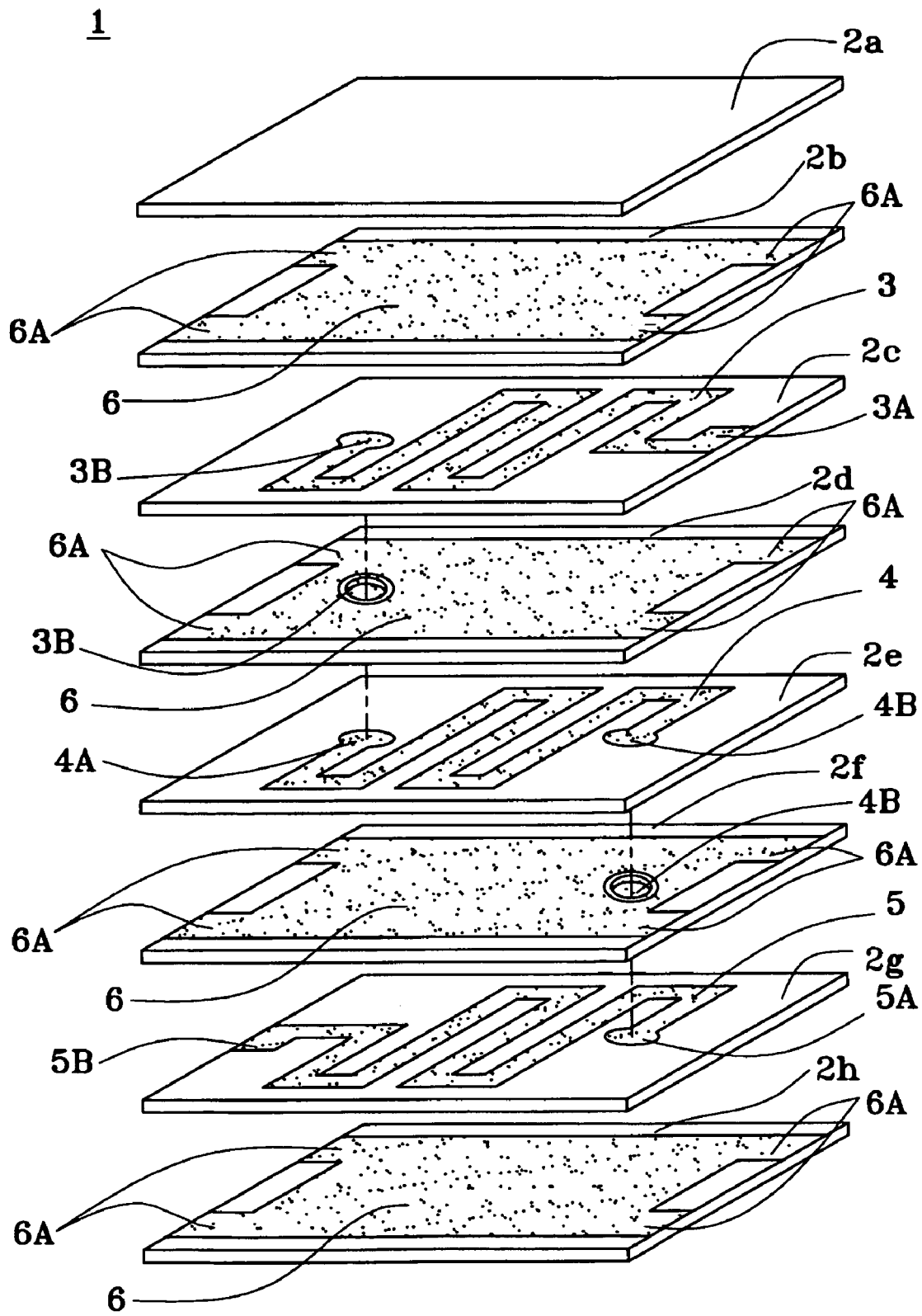
FIG. 9 is an exploded perspective view illustrating a modification of the first preferred embodiment of the present invention.
Figure 10:
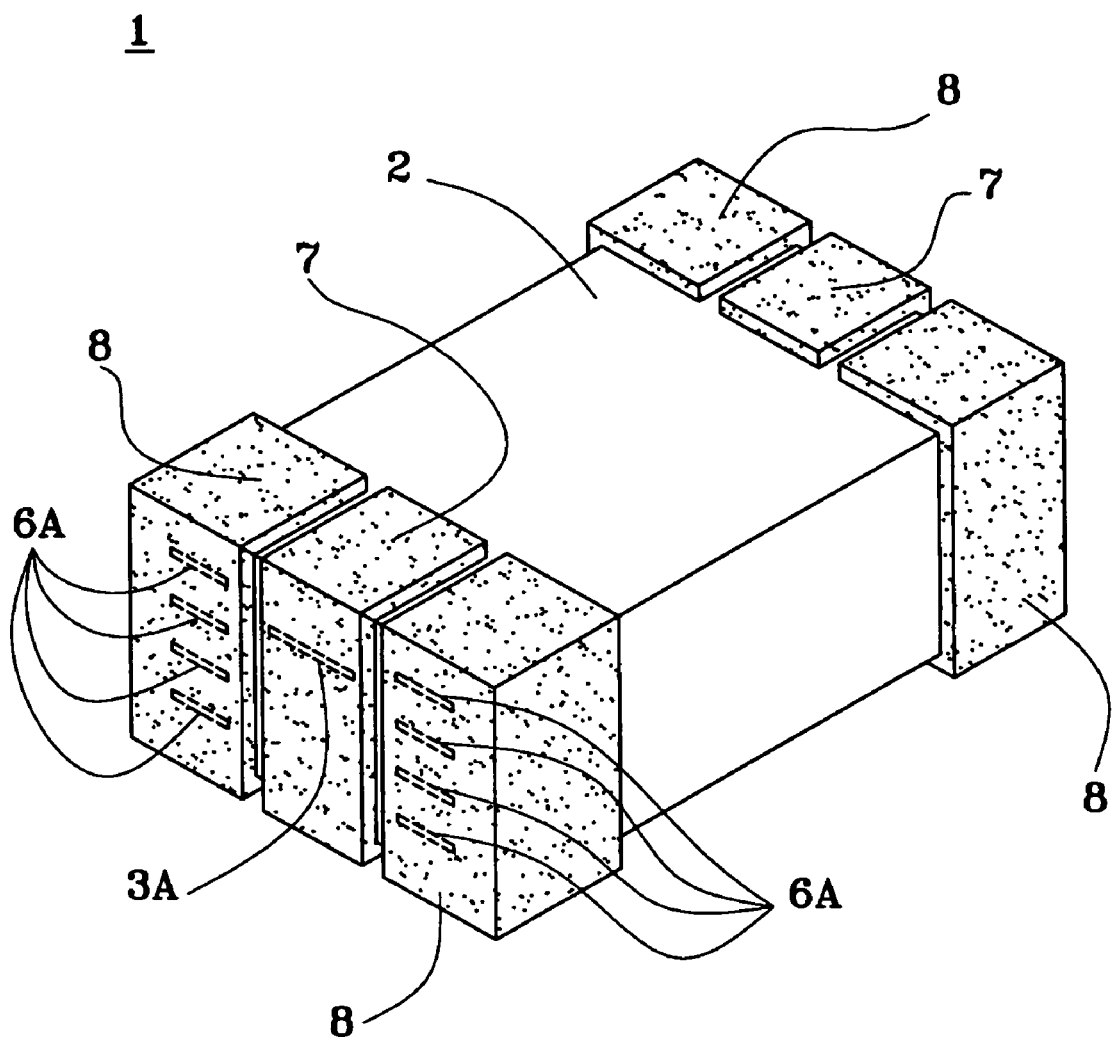
FIG. 10 is a perspective view of the modification of the first preferred embodiment of the present invention.

FIGS. 9 and 10 illustrate a modification of the first preferred embodiment of the present invention. In the modification, each ground conductor 6 has a bifurcated electrode portion 6A extending to each of longitudinal edges of the magnetic layer 2b and 2c as shown in FIG. 9. As shown in FIG. 10, a signal electrode 7 is arranged on each of the two longitudinal ends of a laminate body 2 in the central portion along the width direction thereof. Ground electrodes 8 are arranged on both sides of each signal electrode 7. The signal electrodes 7 are respectively spaced apart from the ground electrodes 8 by a desired distance. The modification of the first preferred embodiment is specifically intended for connection with a coplanar guide.

Figure 11:
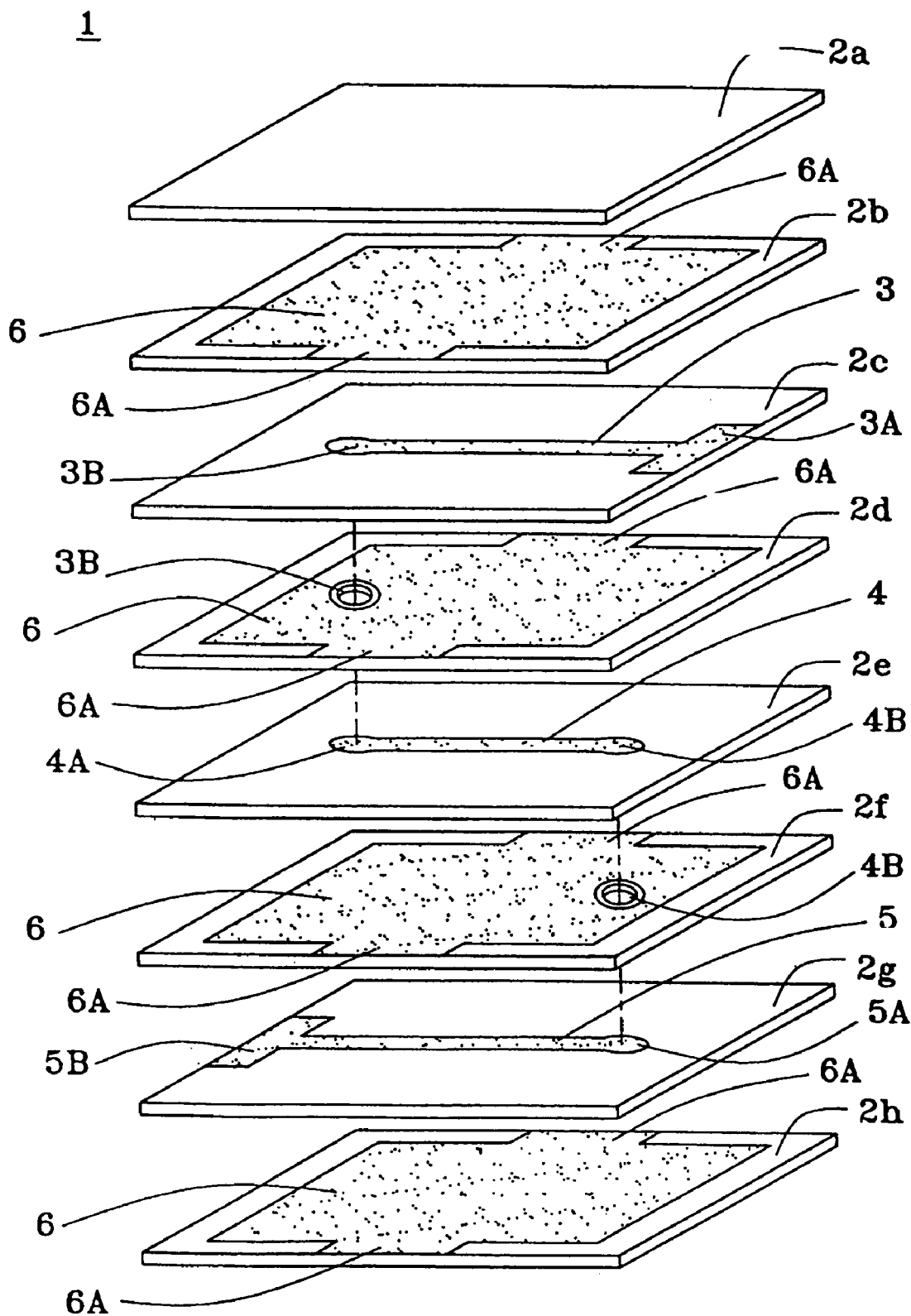
FIG. 11 is an exploded perspective view of another modification of the first preferred embodiment of the present invention.

FIG. 11 illustrates another modification of the first preferred embodiment. As shown, the modification includes straight line conductors 3–5.

Figure 12:
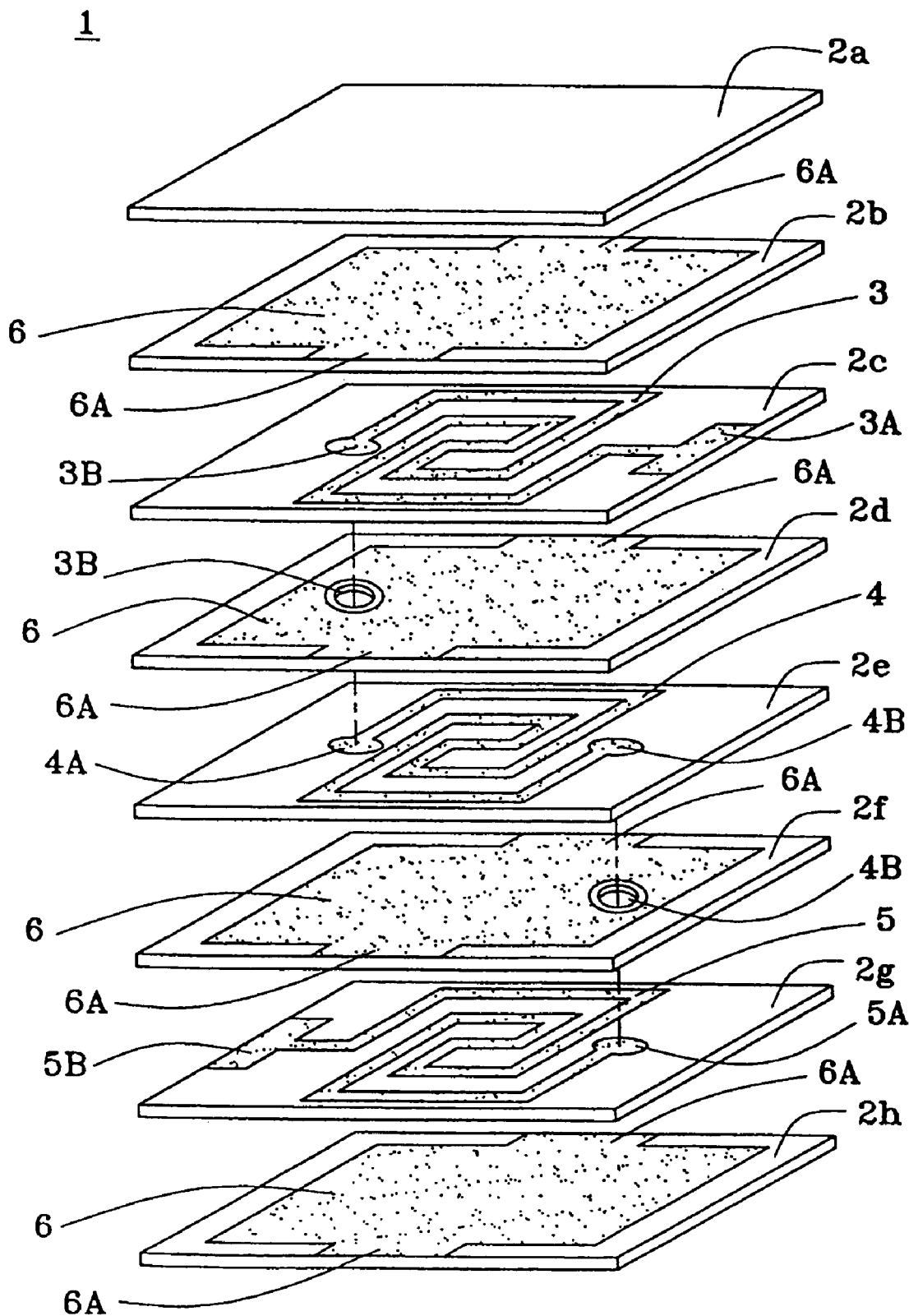
FIG. 12 is an exploded perspective view of yet another modification of the first preferred embodiment of the present invention.

FIG. 12 illustrates yet another modification of the first preferred embodiment of the present invention. As shown, the modification includes spiral line conductors 3–5.

Figure 13:
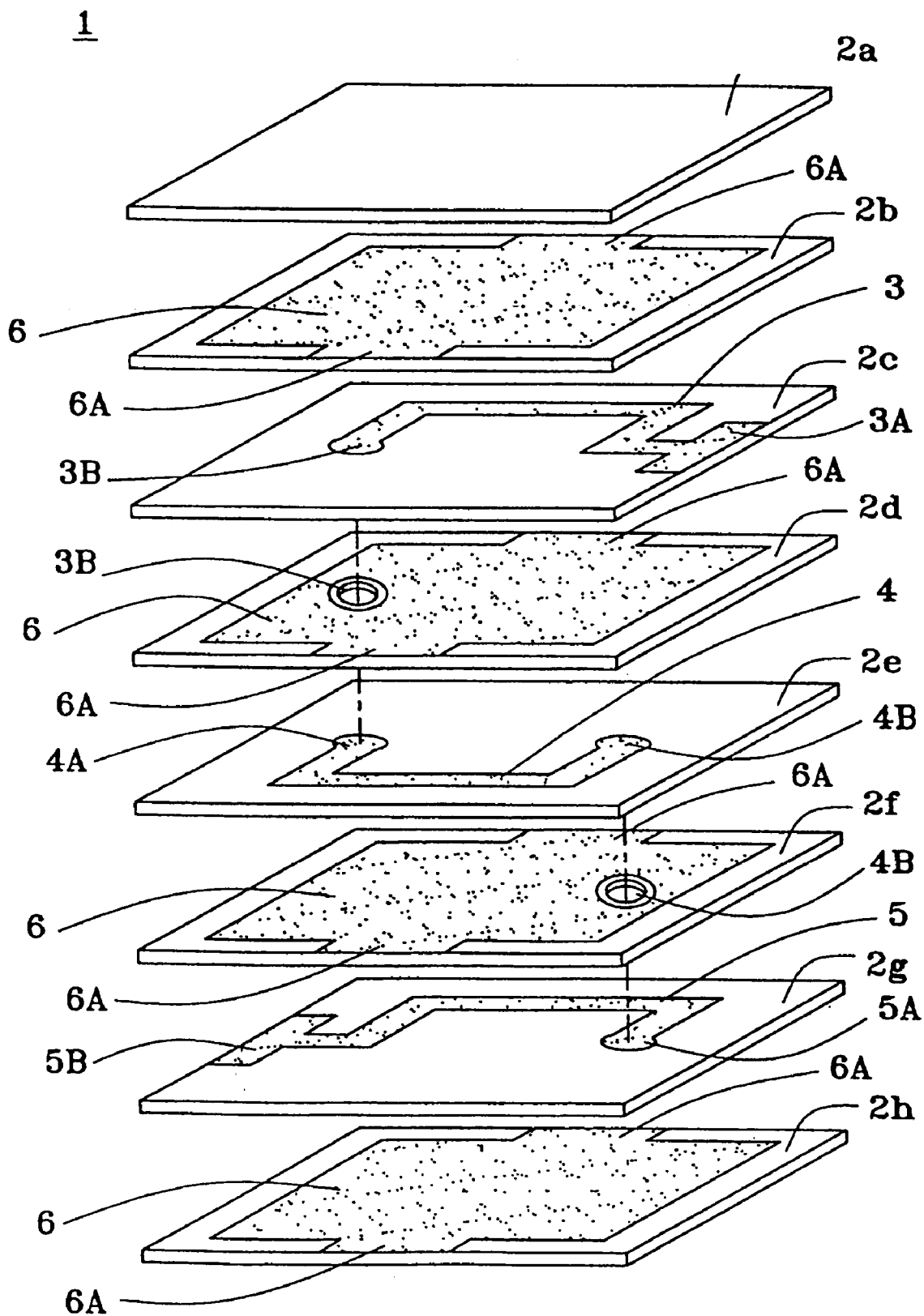
FIG. 13 is an exploded perspective view of a further modification of the first preferred embodiment of the present invention.

FIG. 13 illustrates a further modification of the first preferred embodiment of the present invention. As shown, the modification includes substantially U-shaped line conductors 3–5 having bending portions. With the magnetic layers laminated, the line conductors 3–5, sandwiched between the magnetic layers, form a coil around a center axis extending in the direction of lamination of the magnetic layers.

As shown in FIGS. 9–13, elements that are identical to those shown in FIG. 1 are designated with the same reference numerals, and the discussion thereof is omitted here.

Figure 14:
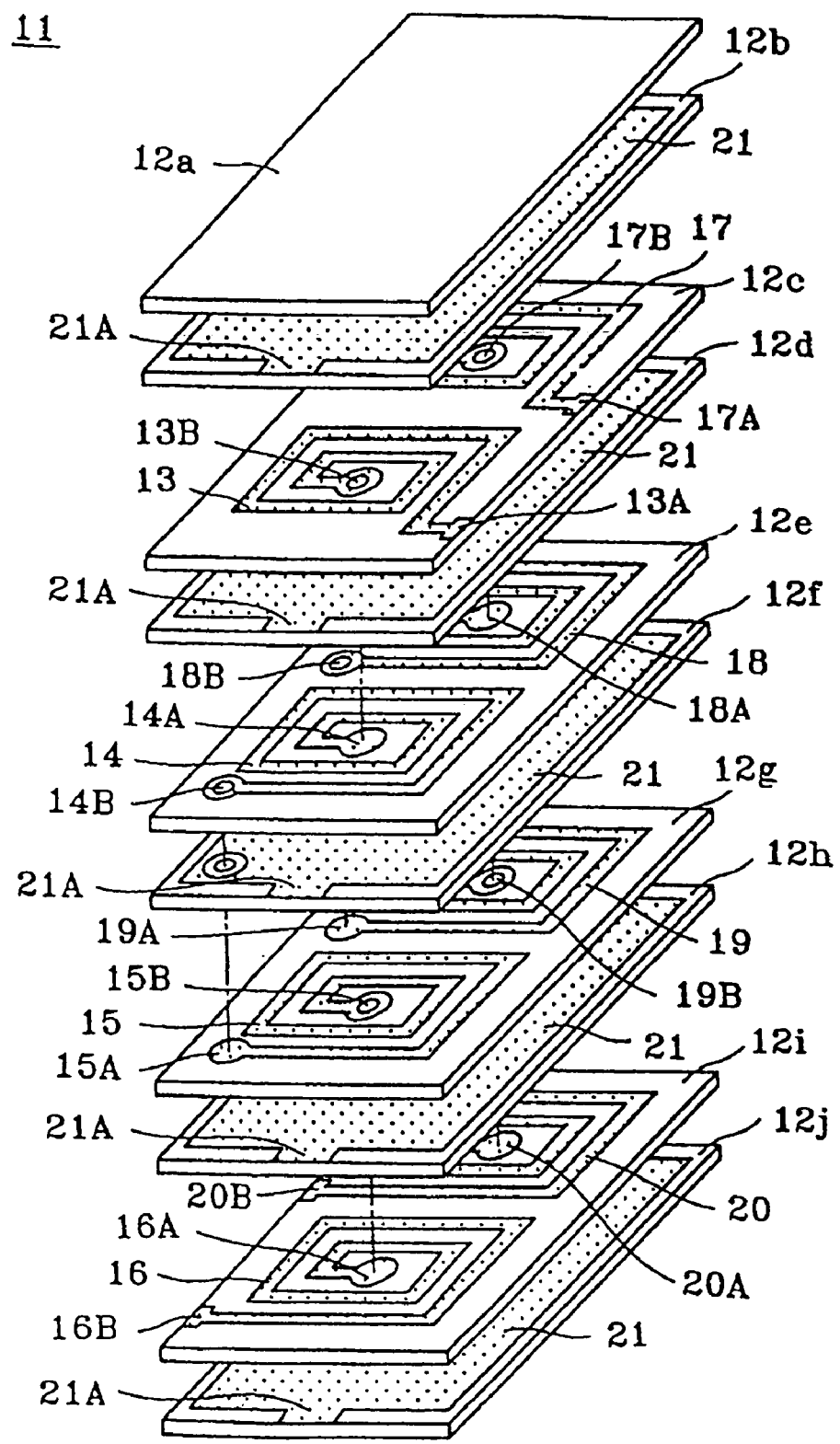
FIG. 14 is an exploded perspective view of a noise filter in accordance with a second preferred embodiment of the present invention.
Figure 15:
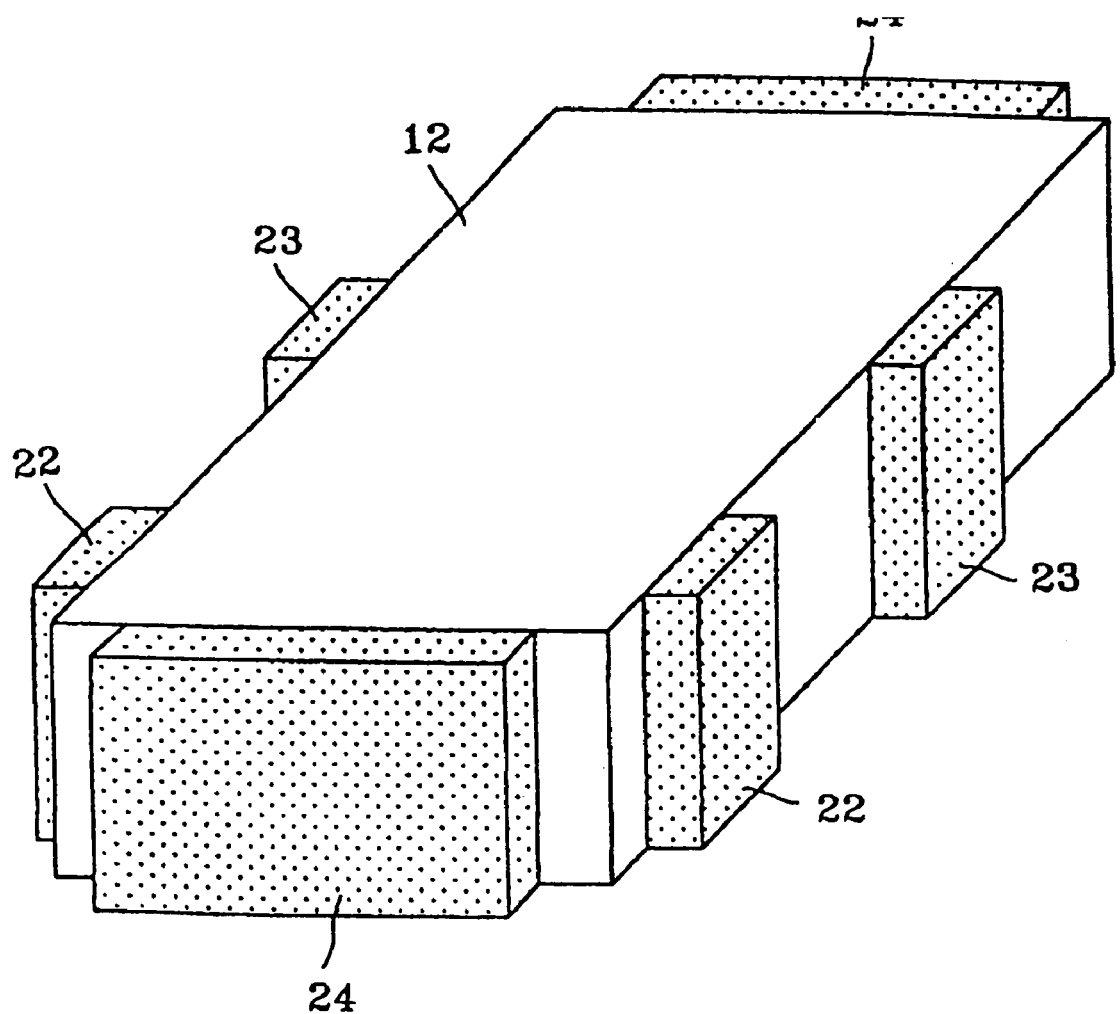
FIG. 15 is a perspective view of the noise filter of the second preferred embodiment of the present invention.

FIGS. 14 and 15 illustrate a noise filter 11 in accordance with a second preferred embodiment of the present invention. The noise filter 11 of the second preferred embodiment of the present invention includes a first line conductor and a second line conductor on the same surface of each layer. The first and second line conductors, and the ground conductor are alternately laminated in the interfaces between the magnetic layers. The plurality of first line conductors are serially connected, and the plurality of second line conductors, separately arranged from the first line conductors, are serially connected.

More specifically, the noise filter 11 of the second preferred embodiment includes, as the major elements thereof, magnetic layers 12a–12j, first line conductors 13–16, second line conductors 17–20, ground conductors 21, first signal electrodes 22, and second signal electrodes 23.

A prism-like laminate body 12 defines the external outline of the noise filter 11 and is manufactured by laminating ten magnetic layers 12a–12j. Each of the magnetic layers 12a–12j is preferably substantially rectangular and made of a magnetic oxide material.

The first line conductors 13–16 are arranged on four layers, specifically, between the magnetic layers 12b and 12c, between the magnetic layers 12d and 12e, between the magnetic layers 12f and 12g, and between the magnetic layers 12h and 12i. Each of the line conductors 13–16, made of an electrically conductive material, has a spiral shape. The first conductors 13–16 face each other in the direction of thickness of the laminate body 12.

The line conductor 13 has, on one end thereof, an electrode portion 13A that extends to a longitudinal end of the laminate body 12, and, on the other end thereof, a via hole 13B that is located at the approximate center of the spiral shape, and penetrates the magnetic layers 12c and 12d.

The line conductor 14 has, on one end thereof, a junction portion 14A that is located at the approximate center of the spiral shape, and is connected to the line conductor 13 through the via hole 13B. The line conductor 14 has, on the other end thereof, a via hole 14B that is located at the external end of the spiral shape and penetrates through the magnetic layers 12e and 12f. Likewise, the line conductor 15 has, on one end thereof, a junction portion 15A that is located at the external end of the spiral shape and, on the other end thereof, a via hole 15B that is located at the approximate center of the spiral shape.

The line conductor 16 has, on one end thereof, a junction portion 16A that is located at the approximate center of the spiral shape and is connected to the line conductor 15 through the via hole 15B. The line conductor 16 has, on the other end, an electrode portion 16B that is located at the external end of the spiral shape, particularly, at the longitudinal end of the laminate body 12.

The via holes 13B, 14B, and 15B are filled with an electrically conductive material such as a silver paste or palladium, and the line conductors 13–16 are serially connected.

The second line conductors 17–20 are arranged on four magnetic layers, more specifically, between the magnetic layers 12b and 12c, between the magnetic layers 12d and 12e, between the magnetic layers 12f and 12g, and between the magnetic layers 12h and 12i. The locations of the second line conductors 17–20 are shifted from the first line conductors 13–16 in a length direction of the laminate body 12, and are respectively insulated from the first line conductors 13–16. Each of the second line conductors 17–20, made of an electrically conductive material, has a spiral shape. The second line conductors 17–20 face each other in the direction of thickness of the laminate body 12.

The second line conductors 17–20 are substantially identical in shape to the first line conductors 13–16. The second line conductor 17 has, on one end thereof, an electrode portion 17A and, on the other end thereof, a via hole 17B. Likewise, the second line conductors 18 and 19 have, respective ends thereof, junction portions 18A and 19A and, on the other ends thereof, via holes 18B and 19B. The second line conductor 20 has, on one end thereof, a junction portion 20A and, on the other end thereof, an electrode portion 20B.

The via holes 17B, 18B and 19B are filled with an electrically conductive material such as a silver paste or palladium, and are serially connected.

The ground conductors 21 are arranged between the magnetic layers 12a–12j such that the first line conductors 13–16 and the second line conductors 17–20 are sandwiched therebetween. One ground conductor 21 is arranged on the top magnetic layer 12b, another ground conductor 21 is arranged on the bottom magnetic layer 12j, and further each of the remaining ground conductors 21 alternates with a corresponding one of the first line conductors 13–16 and a corresponding one of the second line conductors 17–20 in arrangement in the interfaces between the magnetic layers 12b–12i.

The ground conductors 21, made of an electrically conductive material, are substantially rectangular, and substantially cover one entire surface of the respective magnetic layers 12b–12i. Like the ground conductors 6 in accordance with the first preferred embodiment, each of the ground conductors 21 includes electrode portions 21A that projects toward the longitudinal end of the laminate body 12. The electrode portions 21A are connected to ground electrodes 24.

The first signal electrodes 22 are arranged on both sidewalls of the laminate body 12 (the magnetic layers 12a–12j) closer to the longitudinal end of the laminate body 12. The first signal electrodes 22, made of an electrically conductive material, are connected to signal lines. One first signal electrode 22 is connected to the electrode portion 13A of the line conductor 13 while the other first signal electrode 22 is connected to the electrode portion 16B of the line conductor 16.

The second signal electrodes 23 are arranged on both sidewalls of the laminate body 12 (the magnetic layers 12a–12j). The locations of the second signal electrode 23, made of an electrically conductive material, are shifted from those of the first signal electrodes 22 in the longitudinal direction of the laminate body 12, and isolated from the first signal electrodes 22. One second signal electrode 23 is connected to the electrode portion 17A of the second line conductor 17 while the other second signal electrode 23 is connected to the electrode portion 20B of the second line conductor 20.

One first signal electrode 22 and one signal electrode 23 define signal input electrodes, and the other first signal electrode 22 and the other second signal electrode 23 define signal output electrodes. Alternatively, one first signal electrode 22 and one second signal electrode 23 may define the signal output electrodes, and the other first signal electrode 22 and the other second signal electrode 23 may define the signal input electrodes.

The ground electrodes 24 are arranged on both longitudinal ends of the laminate body 12. The ground electrodes 24, made of an electrically conductive material, are connected to the electrode portions 21A of the ground conductors 21.

The second preferred embodiment provides substantially the same advantages as the first preferred embodiment. Since the first line conductors 13–16 are electrically isolated from the second line conductors 17–20, a single laminate body 12 includes a low-pass filter defined by the first line conductors 13–16 and another low-pass filter defined by the second line conductors 17–20. The noise filter 11 is thus a noise filter array including the two low-pass filters. Compared to using two separate low-pass filters, the noise filter 11 provides a compact design because the ground conductors 21, and the ground electrodes 24 are shared by the two low-pass filters.

Figure 16:
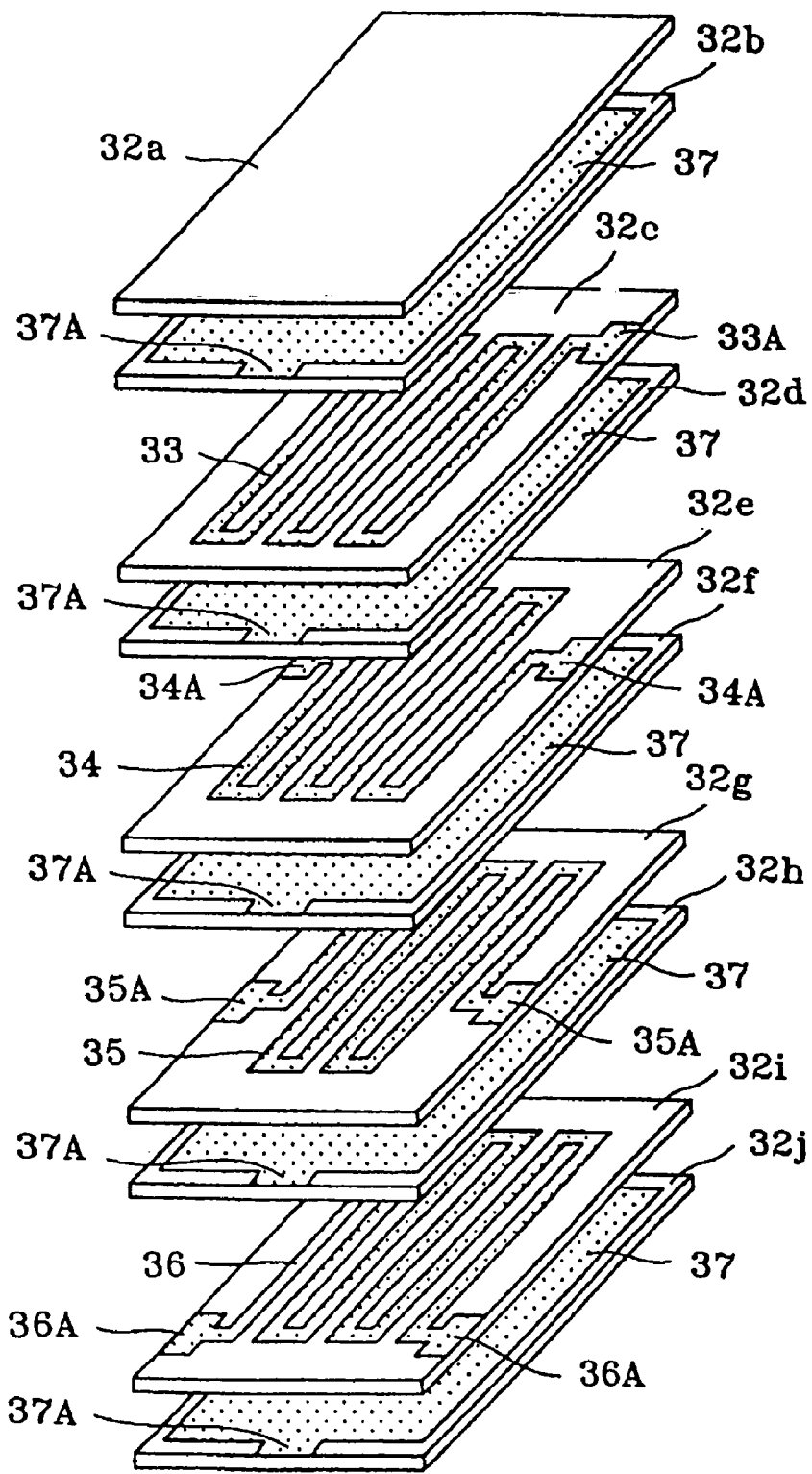
FIG. 16 is an exploded perspective view of a noise filter in accordance with a third preferred embodiment of the present invention.
Figure 17:
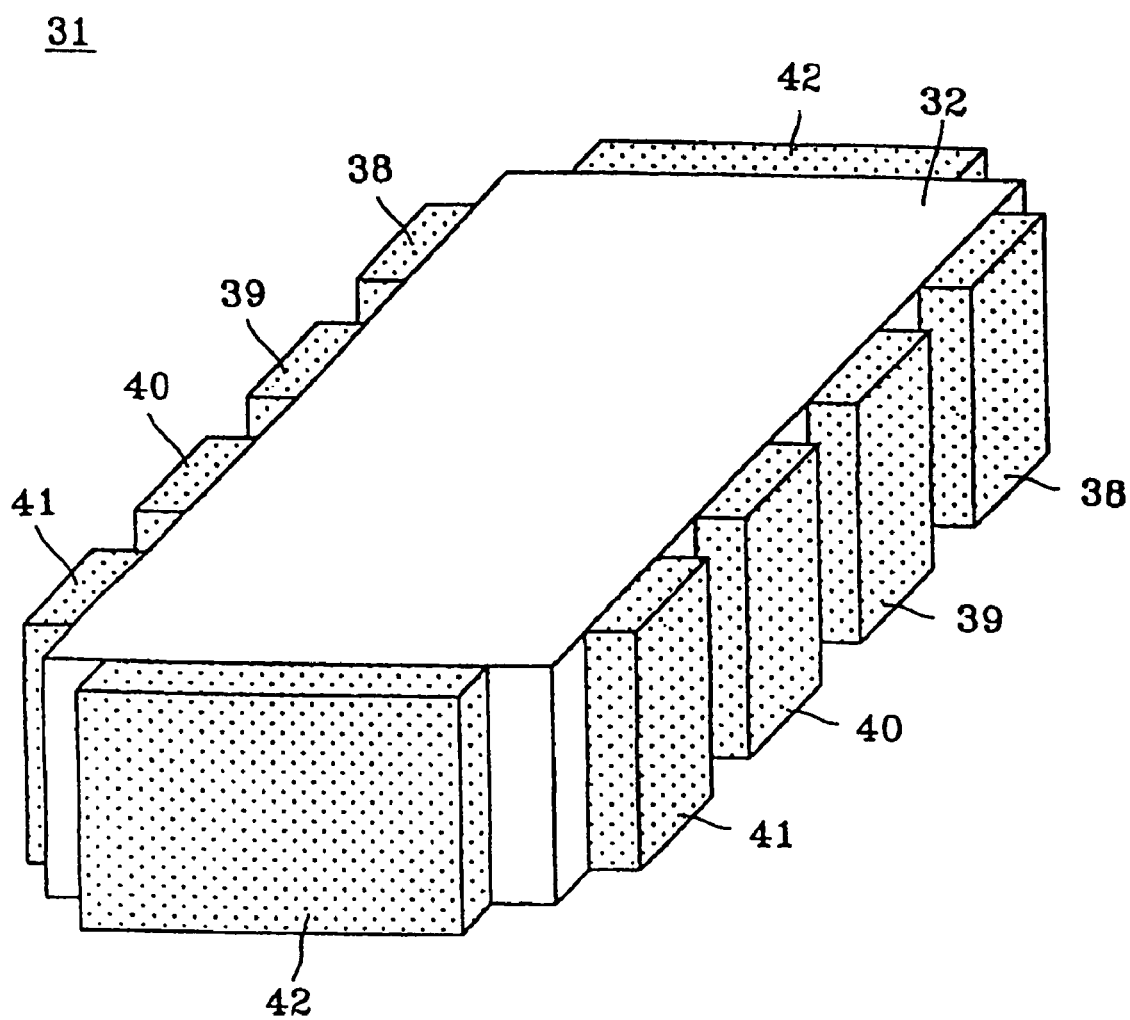
FIG. 17 is a perspective view of the noise filter in accordance with the third preferred embodiment of the present invention.

FIGS. 16–17 illustrate a noise filter 31 in accordance with a third preferred embodiment of the present invention.

In the noise filter 31 of the third preferred embodiment of the present invention, a line conductor alternates with a ground conductor in interfaces between laminated magnetic layers with each of the top and bottom magnetic layer having the ground conductor thereon. Ends of the plurality of line conductors are connected to different signal input electrodes, and the other ends of the plurality of line conductors are connected to different signal output electrodes.

More specifically, the noise filter 31 of the third preferred embodiment of the present invention includes magnetic layers 32a–32j, a first line conductor 33 through a fourth line conductor 36, ground conductors 37, first signal electrodes 38 through fourth signal electrodes 41, and ground electrodes 42.

A prism-like laminate body 32 defines the external outline of the noise filter 31. The laminate body 32 includes ten magnetic layers 32a–32j. The magnetic layers 32a–32j preferably have a substantially rectangular and planar shape, and are preferably made of a magnetic oxide material.

The first line conductor 33 is arranged between the magnetic layers 32b and 32c. The first line conductor 33, in a narrow band configuration and made of an electrically conductive material, meanders in several turns in the width direction of the laminate body 32. The first line conductor 33 has, on both ends thereof, electrode portions 33A reaching the sidewalls of the laminate body 32. The electrode portions 33A are arranged closer to one longitudinal end of the laminate body 32.

The second line conductor 34 is arranged between the magnetic layers 32d and 32e. The second line conductor 34 has substantially the same dimensions as the first line conductor 33. The second line conductor 34, in a narrow band configuration and made of an electrically conductive material, meanders in several turns in the width direction of the laminate body 32. The second line conductor 34 has, on both ends thereof, electrode portions 34A extending to the sidewalls of the laminate body 32. The locations of the electrode portions 34A are shifted from those of the first electrode portion 33A to be closer to the center of the sidewall of the laminate body 32 in the longitudinal direction thereof.

The third line conductor 35 is arranged between the magnetic layers 32f and 32g. The third line conductor 35 preferably has substantially the same dimensions as the first line conductor 33. Like the first line conductor 33, the third line conductor 35, made of an electrically conductive material, meanders in several turns. The third line conductor 35 has, on both ends thereof, electrode portions 35A extending to the sidewalls of the laminate body 32. The location of the electrode portion 35A is shifted from those of the first electrode portion 33A and the second electrode portion 34A, and for example, is located between the second electrode portion 34A and the other longitudinal end of the laminate body 32.

The fourth line conductor 36 is arranged between the magnetic layers 32h and 32i. The fourth line conductor 36 has substantially the same dimensions as the first line conductor 33. Like the first line conductor 33, the fourth line conductor 36, made of an electrically conductive material, meanders in several turns. The fourth line conductor 36 has, on both ends thereof, electrode portions 36A extending to the sidewalls of the laminate body 32. The location of the electrode portion 36A is shifted from those of the first electrode portion 33A, the second electrode portion 34A and the third electrode position 35A, and for example, is located closer to the other longitudinal end of the laminate body 32.

Each of the ground conductors 37 is arranged between the magnetic layers 32a–32j such that the first through fourth line conductors 33–36 are respectively sandwiched therebetween. Ground conductors 37 are respectively arranged on the top and bottom magnetic layers 32b and 32i, and each of the remaining ground conductors 37 alternates with each of the line conductors 33–36 in the interfaces between the magnetic layers 32b–32i.

The ground conductors 37, which are substantially rectangular and planar and are made of an electrically conductive material, substantially cover the magnetic layers 32b–32i. Similar to the ground conductor 6 in the first preferred embodiment, each ground conductor 37 includes electrode portions 37A projecting toward both longitudinal ends of the laminate body 32. The electrode portions 37A are connected to the ground electrodes 42.

The first through fourth signal electrodes 38–41 are made of an electrically conductive material. The first through fourth signal electrodes 38–41 include respective pairs of electrode portions, arranged on both sidewalls along the direction of length of the laminate body 32. The first through fourth signal electrodes 38–41 are located at different positions along the direction of length of the laminate body 32, for example, on the sidewalls from one longitudinal end to the other longitudinal end of the laminate body 32, and are isolated from each other.

The first signal electrodes 38 are respectively connected to the electrode portions 33A of the first line conductor 33, the second signal electrodes 39 are respectively connected to the electrode portions 34A of the second line conductor 34, the third signal electrodes 40 are respectively connected to the third line conductors 35A of the third line conductor 35, and the fourth signal electrodes 41 are respectively connected to the electrode portions 36A of the fourth line conductor 36.

Of the first through fourth pairs of signal electrodes 38–41, one terminal defines a signal input terminal, and the other terminal defines a signal output terminal.

The ground electrodes 42 are arranged on both longitudinal ends of the laminate body 32. The ground electrodes 42 are made of an electrically conductive material, and are connected to the electrode portions 37A of the ground conductors 37.

The third preferred embodiment of the present invention provides substantially the same advantages as the first preferred embodiment of the present invention. Since the plurality of line conductors 33–36 are respectively connected to different signal electrodes 38–41 in accordance with the third preferred embodiment of the present invention, the plurality of line conductors 33–36 define different low-pass filters. The line conductors 33–36 together define a noise filter array.

Since the plurality of line conductors 33–36 define respective low-pass filters in accordance with the third preferred embodiment of the present invention, the number of low-pass filters is increased by merely increasing the number of magnetic layers 32a–32j. Even if a large number of low-pass filters are arranged in the noise filter 31, the noise filter 31 remains compact.

Since no via holes are used, the third preferred embodiment is free from impedance mismatch caused by open via holes. Thus, no noise reflection is produced in the middle of the line conductors 33–36, noise resonance is controlled, and impedance matching with an external circuit is facilitated. Since no via holes are drilled in the magnetic layers 32a–32j, the magnetic layers 32a–32j are substantially covered with the first line conductors 33–36. This arrangement enables the line conductors 33–36 to be lengthened, thereby increasing noise attenuation. Since no via hole drilling operation is required, the manufacturing process of the noise filter 31 is simplified, and the manufacturing costs of the noise filter 31 are reduced.

In accordance with the third preferred embodiment of the present invention, the arrangement of each of the ground conductors 37 between the line conductors 33–36 prevents cross-talk from taking place between adjacent line conductors 33–36. An electrical signal is thus reliably transferred.

Since the plurality of line conductors 33–36 on respective layers are isolated from each other, there is no need to arrange the input signal electrodes 38–41 so as to face the output signal electrodes 38–41. The plurality of line conductors 33–36 are arranged independently and freedom of design is assured.

Figure 18:
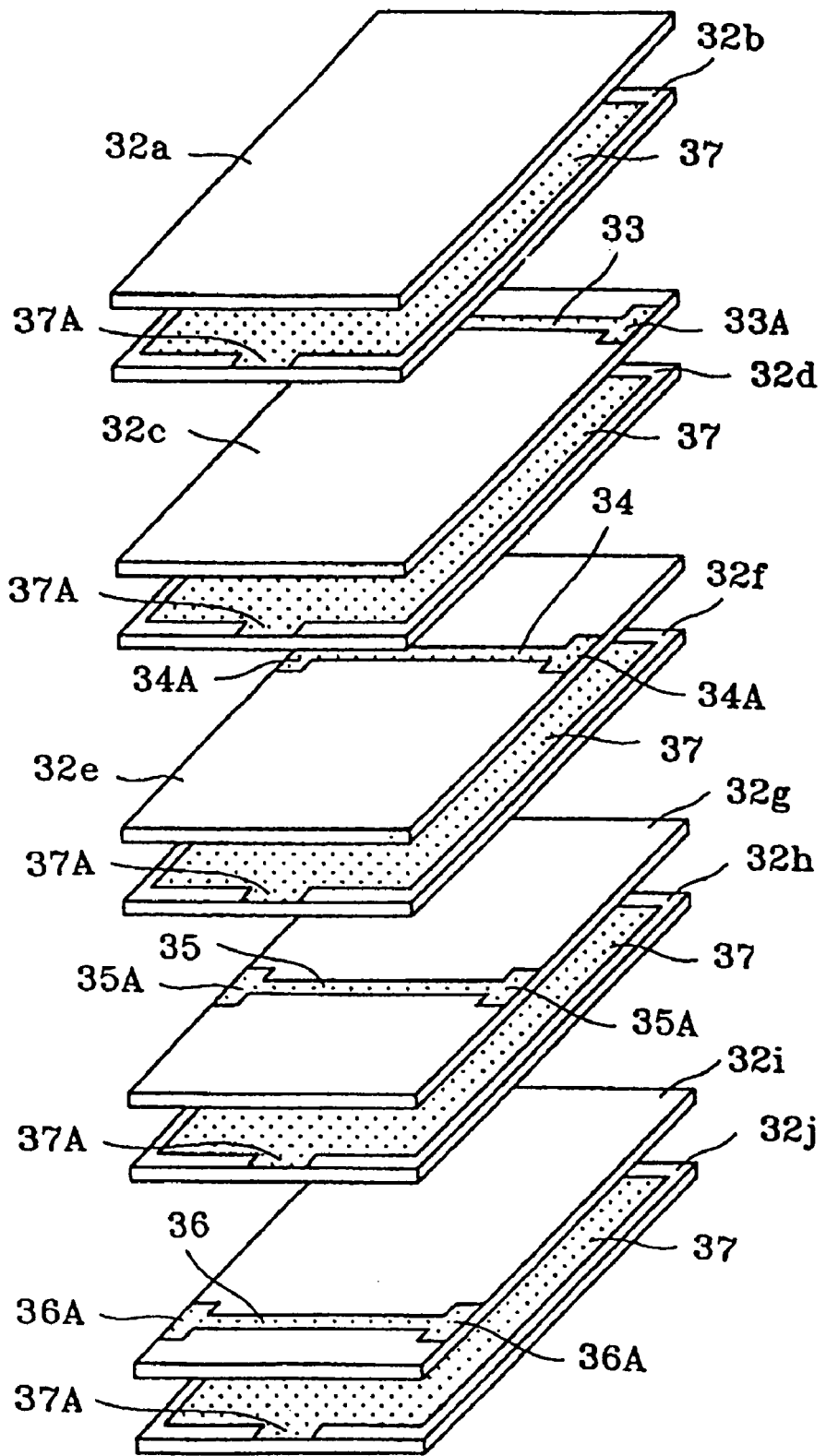
FIG. 18 is an exploded perspective view of a modification of the third preferred embodiment of the present invention.

FIG. 18 illustrates a modification of the third preferred embodiment of the present invention. As shown, the line conductors 33–36 are straight lines.

Figure 19:
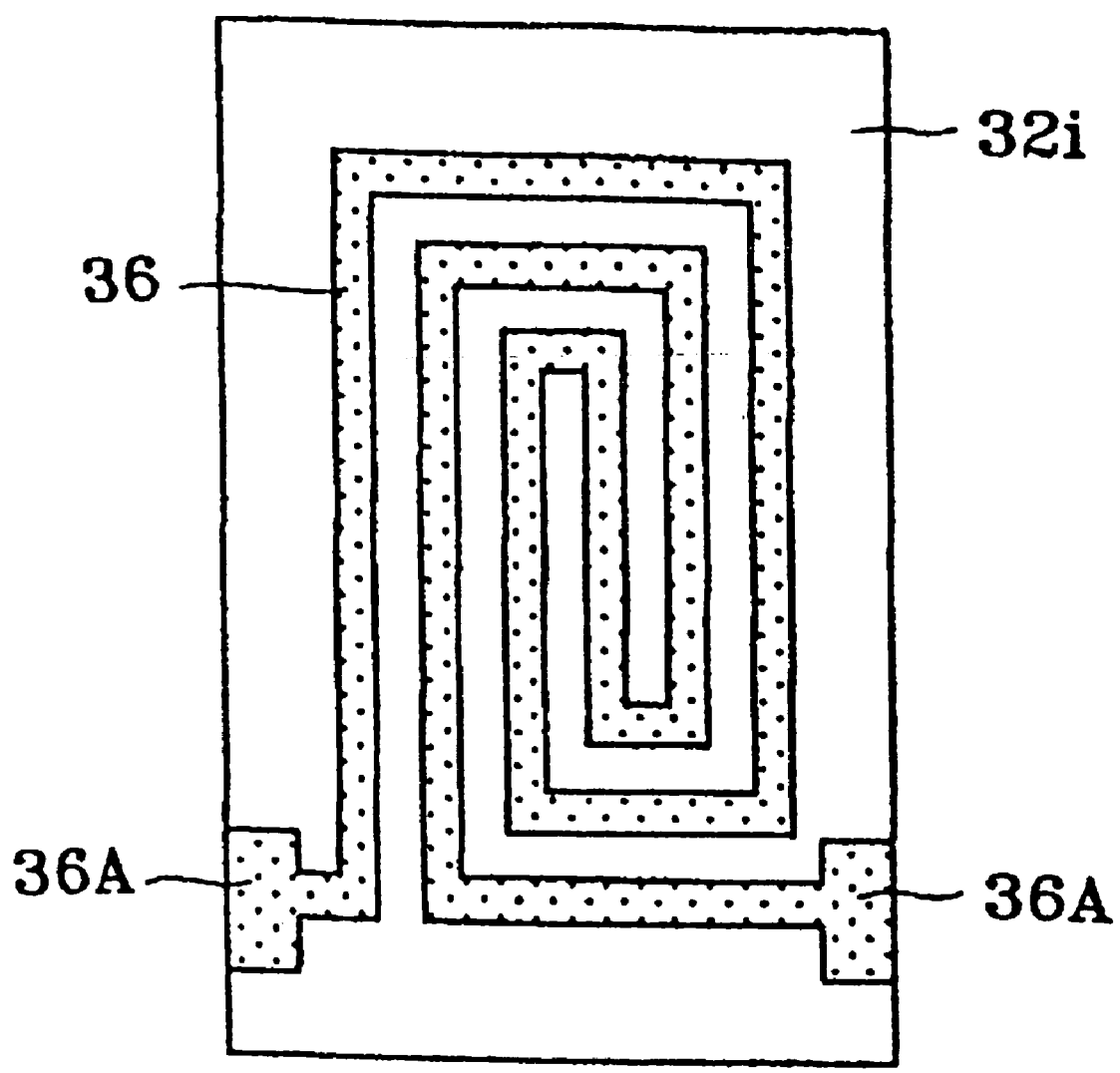
FIG. 19 is a plan view illustrating another modification of the third preferred embodiment of the present invention.

FIG. 19 illustrates another modification of the third preferred embodiment of the present invention. As shown, the line conductors 33–36 have a spiral shape.

Figure 20:
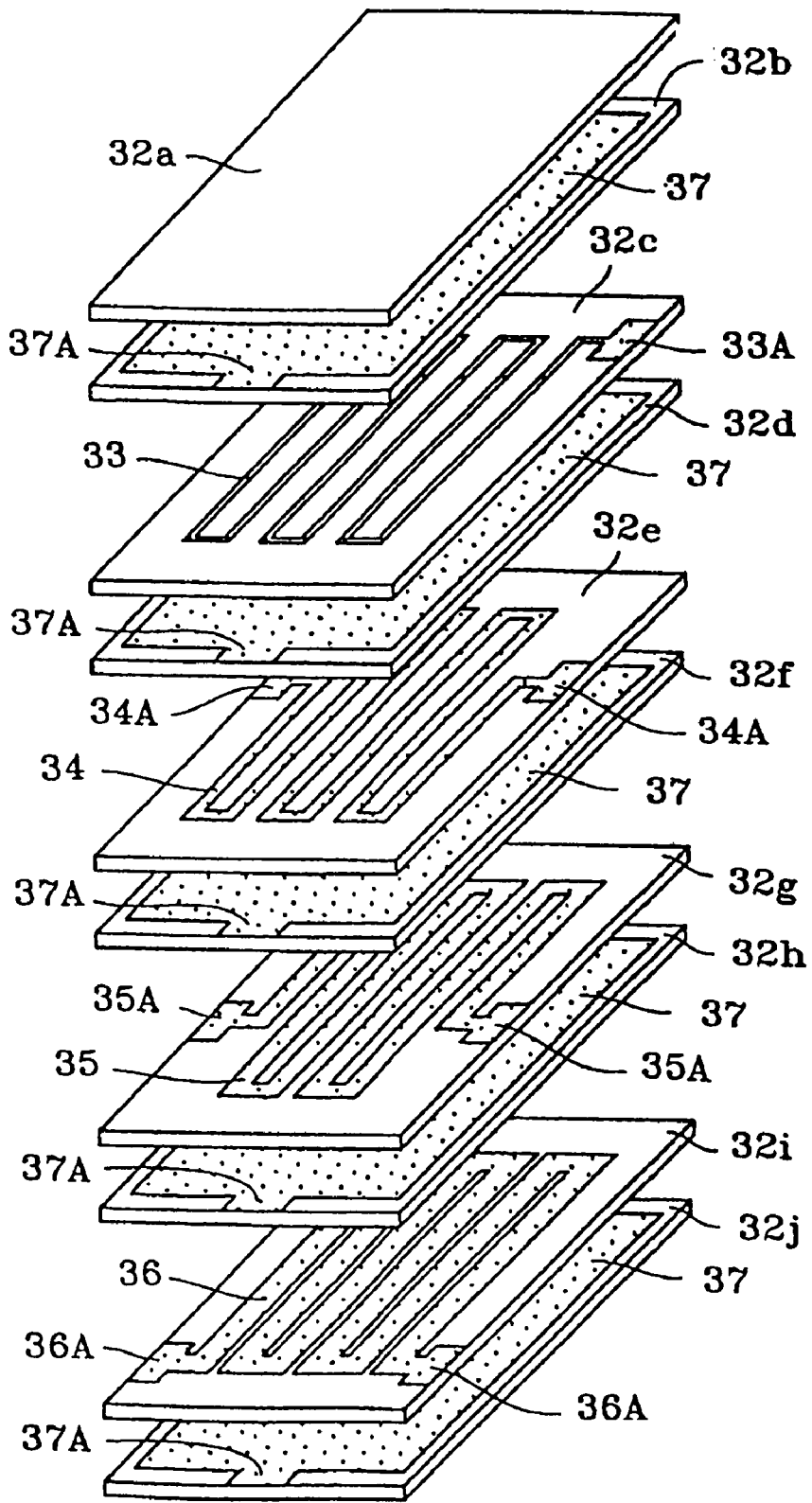
FIG. 20 is an exploded perspective view illustrating yet another modification of the third preferred embodiment of the present invention.

FIG. 20 illustrates yet another modification of the third preferred embodiment of the present invention. In this modification, the line widths of the line conductors 33–36 are different. The plurality of line conductors 33–36 having different characteristic impedances are impedance matched to external lines having a plurality of characteristic impedances when the line conductors 33–36 are connected to the external lines. The plurality of line conductors 33–36 having different characteristic impedances define low-pass filters having four types of characteristic impedances which depend upon the number of layers having the line conductors 33–36 when the line conductors 33–36 are used independently.

When two layers, three layers or all layers (four layers) of the plurality of line conductors 33–36 are used in a parallel connection, a plurality of types (10 types, for example) of characteristic impedances are achieved. As compared to the case in which the line conductors 33–36 are set to have same characteristic impedance, the number of types of characteristic impedances is large, and the number of types of matching lines is thus increased.

In the third preferred embodiment, not only the line width of the line conductors 33–36, but also the width dimensions of the magnetic layers 32b–32i may be different from each other to differentiate the characteristic impedance of each low-pass filter. Both the line width of the line conductors 33–36 and the thickness of the magnetic layers 32b–32i may be different from each other.

Figure 21:
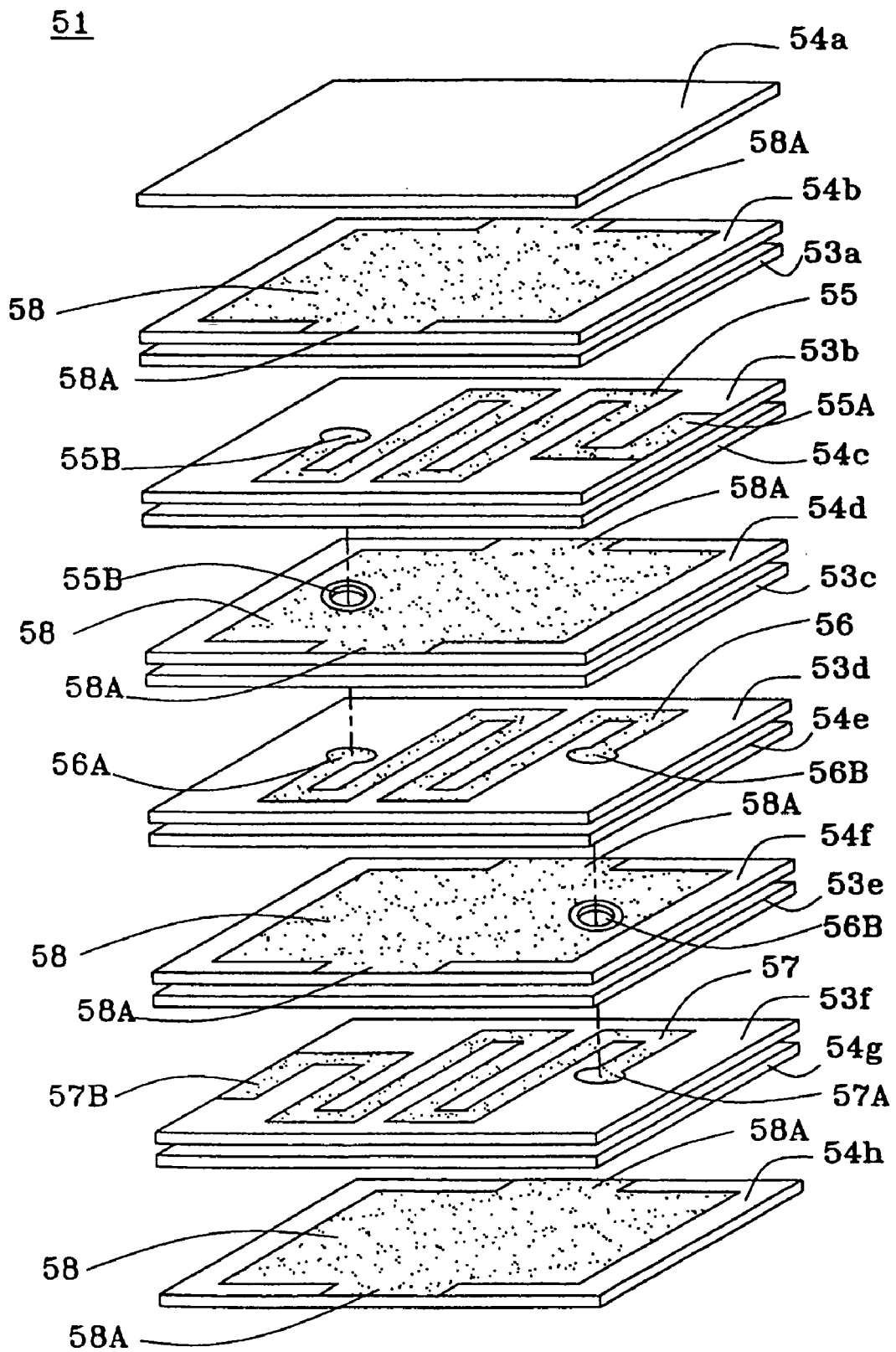
FIG. 21 is an exploded perspective view illustrating a noise filter in accordance with a fourth preferred embodiment of the present invention.
Figure 22:
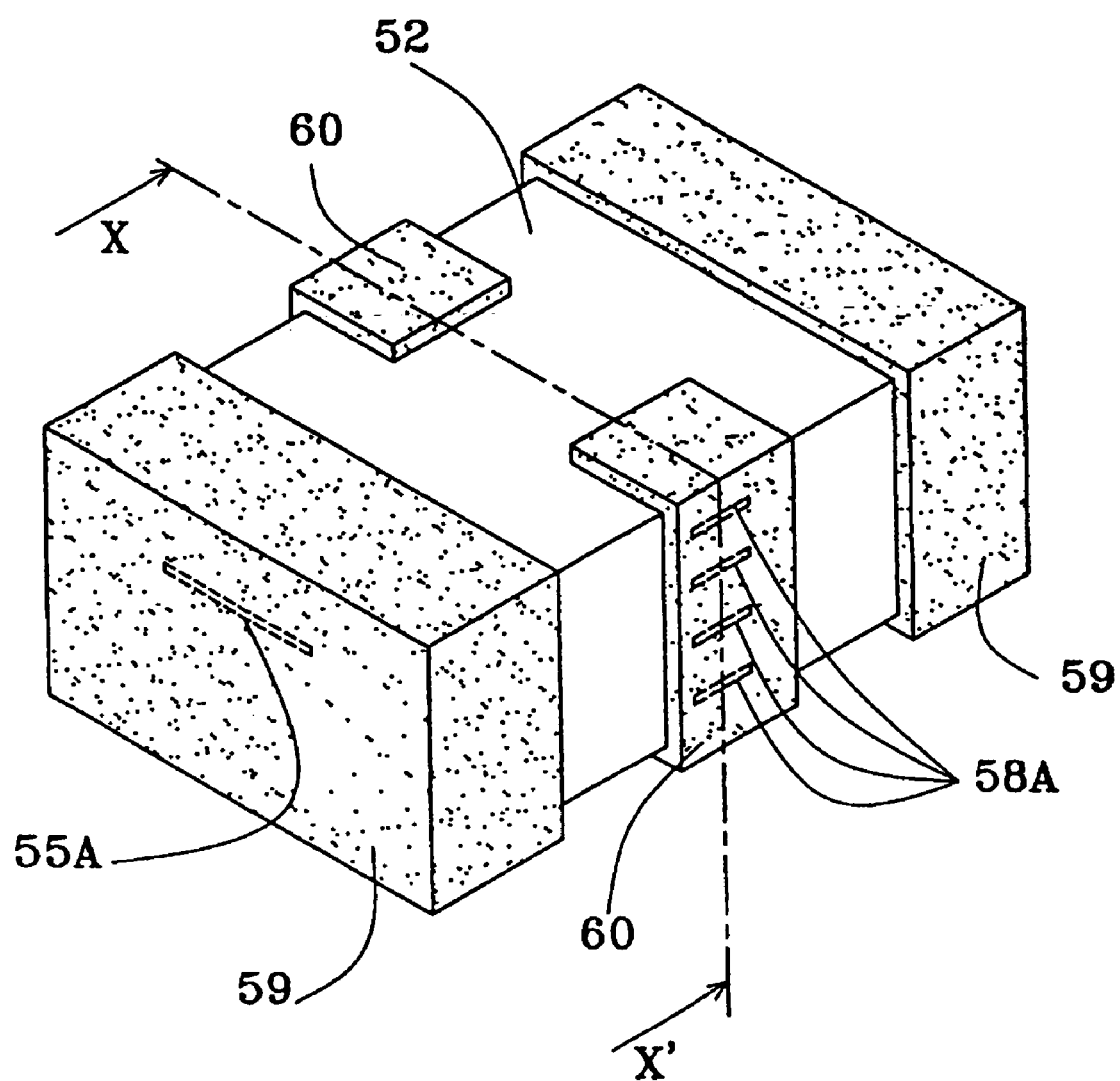
FIG. 22 is a perspective view illustrating the noise filter in accordance with the fourth preferred embodiment of the present invention.
Figure 23:
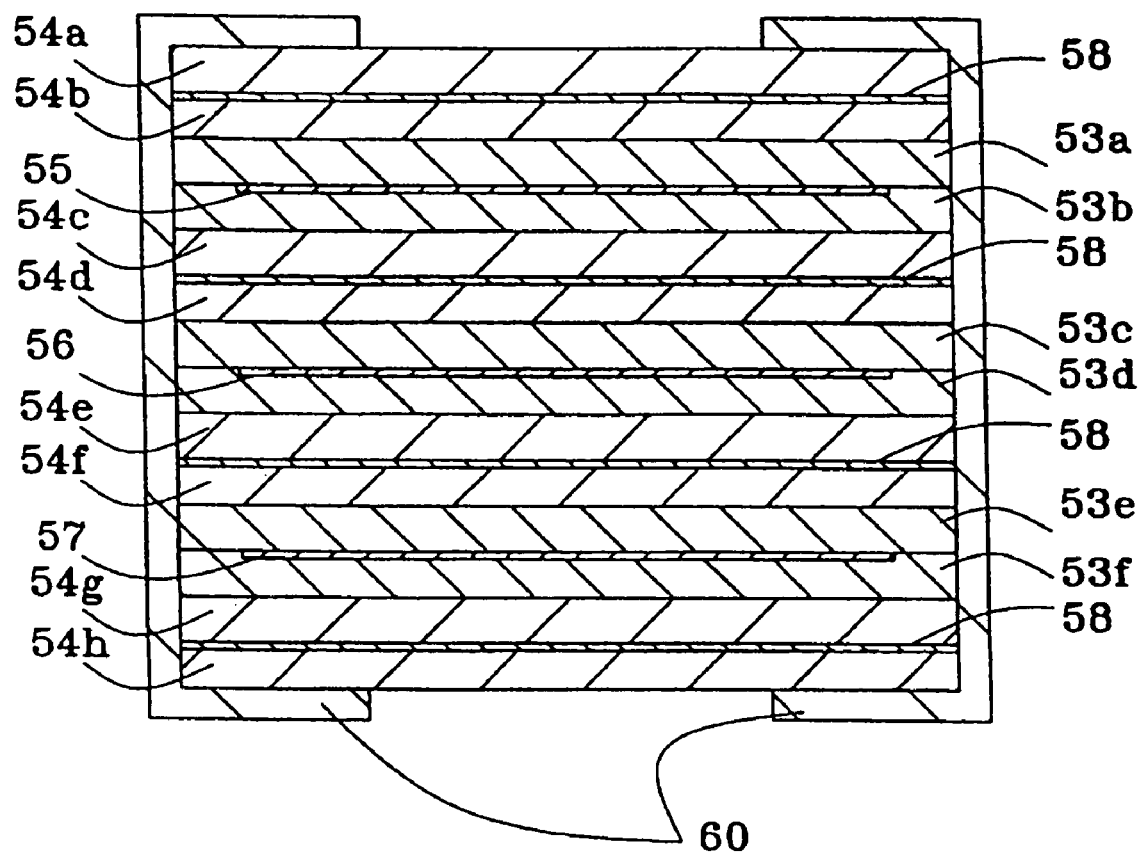
FIG. 23 is a sectional view of the noise filter of FIG. 22 taken along line X–X'.

FIGS. 21–23 illustrate a noise filter 51 in accordance with a fourth preferred embodiment of the present invention. The noise filter 51 of the fourth preferred embodiment includes a dielectric layer between magnetic layers.

The noise filter 51 of the fourth preferred embodiment includes magnetic layers 53a–53f, dielectric layers 54a–54h, line conductors 55–57, ground conductors 58, signal electrodes 59, and ground electrodes 60.

The prism-like laminate body 52 defines the external outline of the noise filter 51. The laminate body 52 is manufactured by pressing the six magnetic layers 53a–53f and the eight dielectric layers 54a–54h in the alternately laminated state thereof, and then by sintering the laminate of the six magnetic layers 53a–53f and the eight dielectric layers 54a–54h.

The magnetic layers 53a–53f and the dielectric layers 54a-54h are laminated such that two magnetic layers alternate with two dielectric layers. The line conductor 55 is arranged between the magnetic layers 53a and 53b, the line conductor 56 is arranged between the magnetic layers 53c and 53d, and the line conductor 57 is arranged between the magnetic layers 53e and 53f. The ground conductors 58 are respectively arranged between the dielectric layers 54a and 54b, between the dielectric layers 54c and 54d, between the dielectric layers 54e and 54f, and between the dielectric layers 54g and 54h.

The magnetic layers 53a–53f are substantially rectangular and planar and are made of an electrically conductive material. The dielectric layers 54a–54h are substantially rectangular and planar and are made of a dielectric material.

The order of lamination and the number of magnetic layers 53a–53f and the dielectric layers 54a–54h are not limited to the fourth preferred embodiment of the present invention. For example, any layer having no conductor pattern printed thereon may be interposed between the magnetic layers 53a–53f and the dielectric layers 54a–54h.

The remainder of the structure of the noise filter 51 of the fourth preferred embodiment is unchanged from-the first preferred embodiment of the present invention and a further discussion of the fourth preferred embodiment is omitted.

The fourth preferred embodiment provides substantially the same advantages as the first preferred embodiment of the present invention. Since the dielectric layer is interposed between the magnetic layers in the fourth preferred embodiment, a noise filter with adjustable characteristic impedance is provided without significantly changing the structure of the noise filter.

The characteristic impedance Zo of the noise filters of preferred embodiments of the present invention is expressed by $Zo=\sqrt{(\Delta L/\Delta C)}$, and is determined by an inductance of the line conductor and a capacitance between the line conductor and the ground conductor. More specifically, if the dielectric constant of the dielectric layer is less than the dielectric constant of the magnetic layer with the dielectric layer interposed between the magnetic layers in the noise filter 51, the characteristic impedance of the noise filter 51 is high as compared to a noise filter that includes only magnetic layers without any dielectric layer. If the dielectric constant of the dielectric layer is greater than the dielectric constant of the magnetic layer, the characteristic impedance of the noise filter 51 is low as compared to a noise filter that includes only magnetic layers without any dielectric layer. In view of this fact, the characteristic impedance of the noise filter 51 is matched to the characteristic impedance of a circuit board on which the noise filter 51 is to be mounted. The effect of signal reflection is effectively controlled.

Since dielectric materials typically have a higher insulating withstand voltage than magnetic materials, the noise filter 51 has increased insulating withstand voltage between the line conductor and the ground conductor. In the noise filter 51, the dielectric layers sandwich the ground conductor, and the magnetic layers sandwich the line conductor. This arrangement reduces the thickness of the layer between the line conductor and the ground conductor. A compact noise filter 51 is thus achieved.

Figure 24:
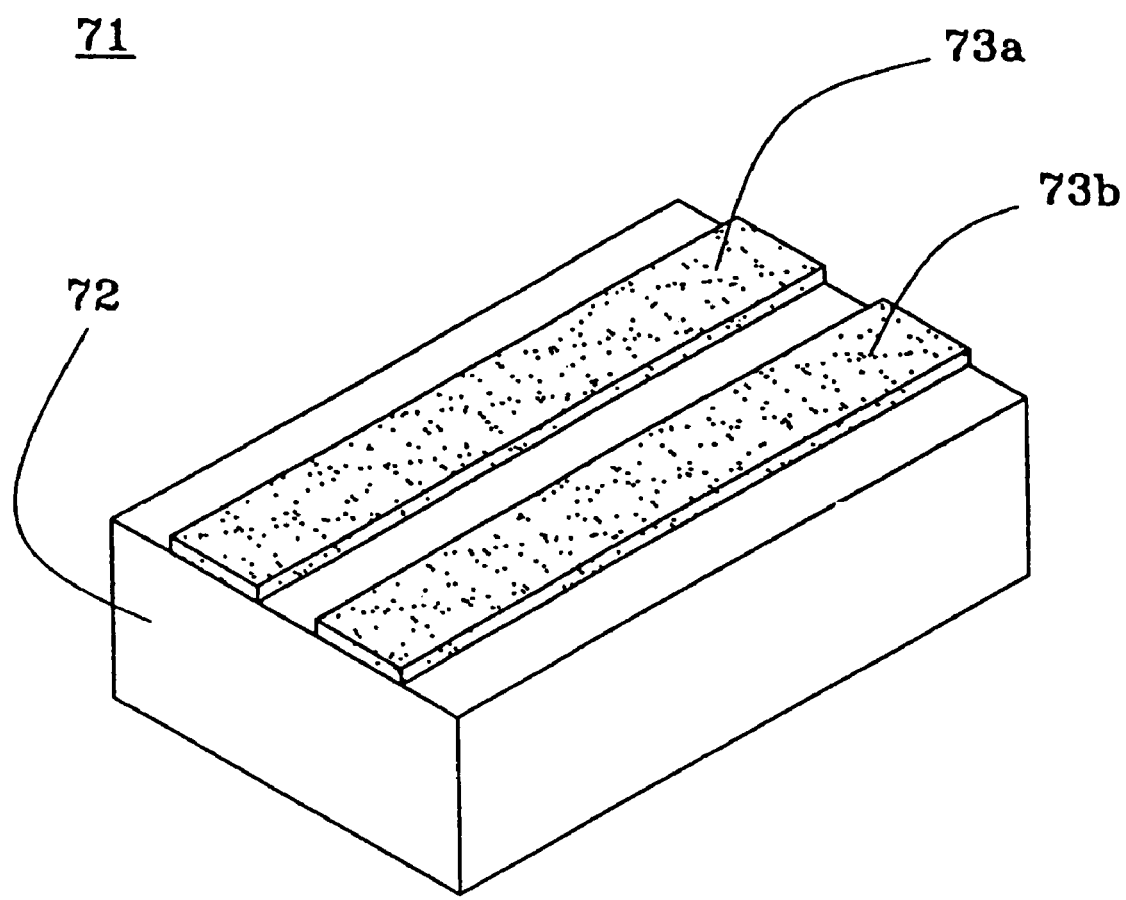
FIG. 24 is a perspective view of a noise filter in accordance with a fifth preferred embodiment of the present invention.

FIG. 24 illustrates a noise filter 71 in accordance with a fifth preferred embodiment of the present invention. As shown, the noise filter 71 of the fifth preferred embodiment of the present invention includes a magnetic body 72 and line conductors 73a and 73b that are arranged at the same level on the surface of the magnetic body 72 and extend alongside each other with a space maintained therebetween.

The fifth preferred embodiment of the present invention thus constructed provides substantially the same advantages as the first preferred embodiment of the present invention.

Figure 25:
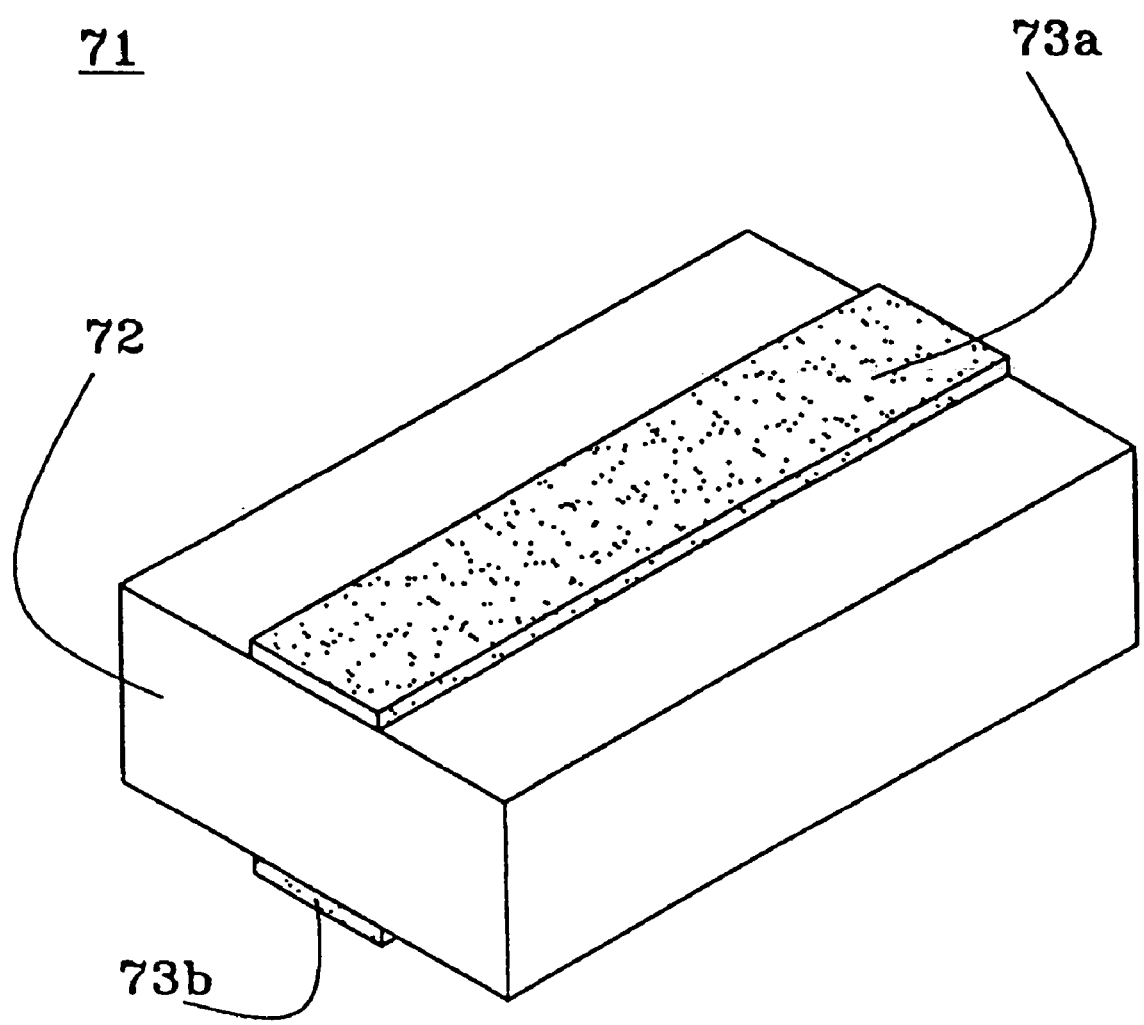
FIG. 25 is a perspective view of a noise filter in accordance with a sixth preferred embodiment of the present invention.
Figure 26:
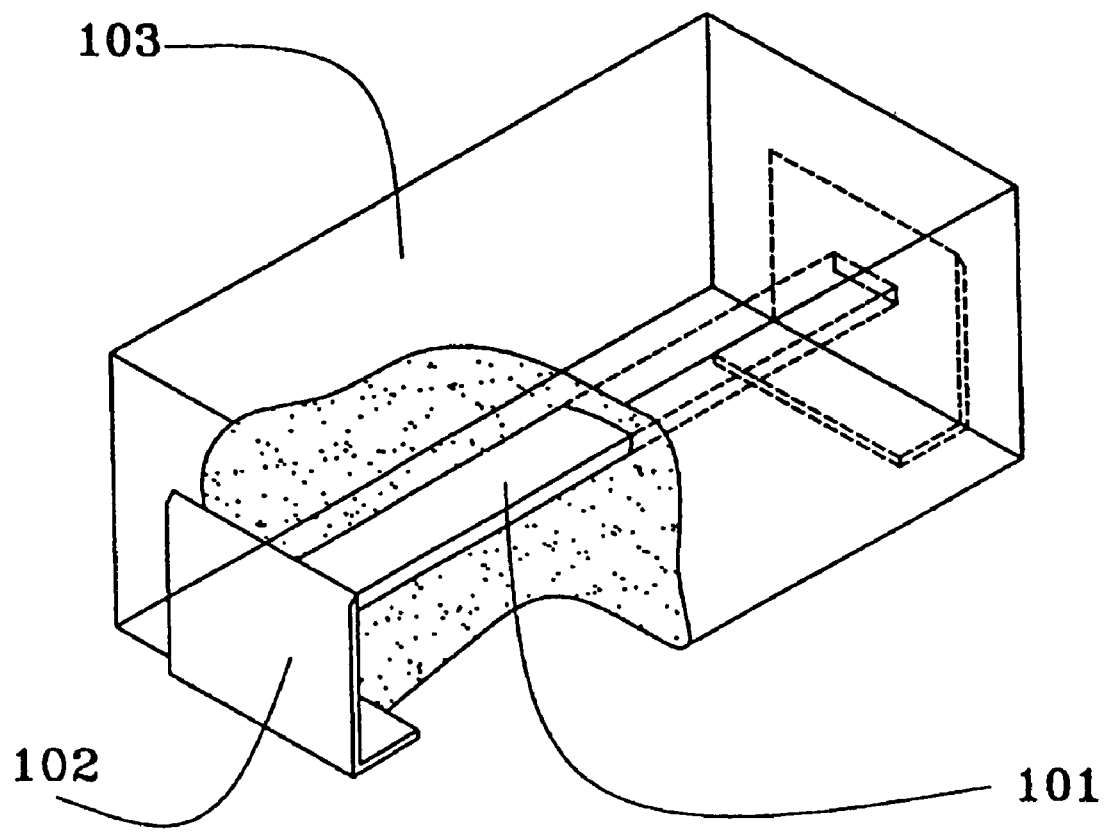
FIG. 26 is a perspective view of a known noise filter with a portion thereof broken away.
Figure 27:
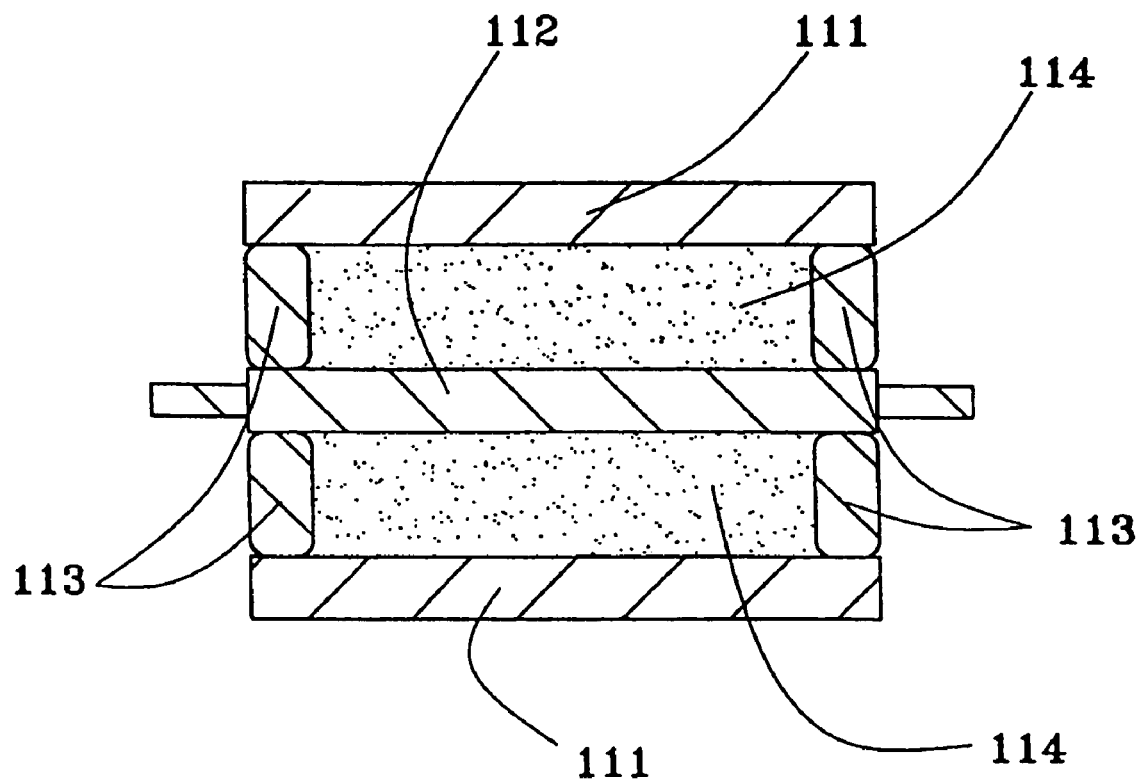
FIG. 27 is a sectional view of another known noise filter.
Figure 28:
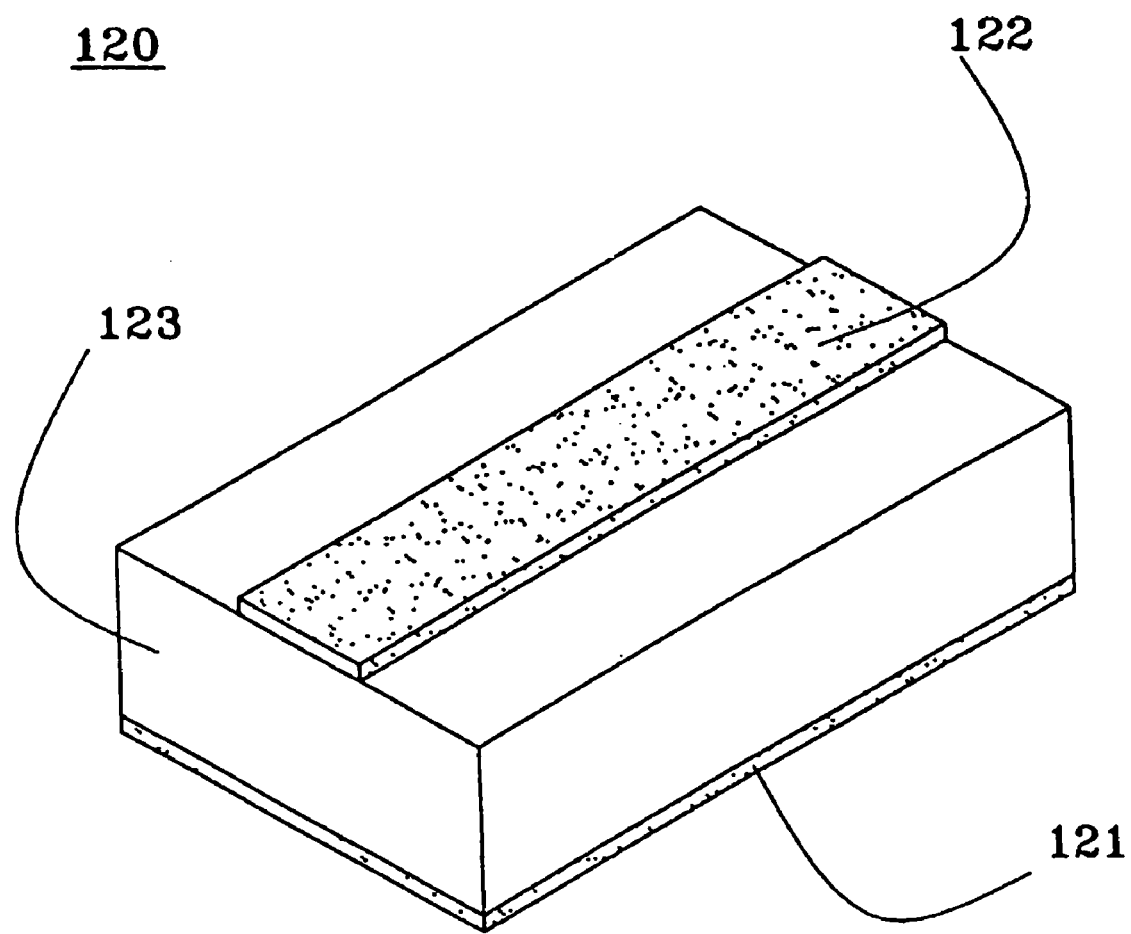
FIG. 28 is a perspective view of yet another known noise filter.

FIG. 25 illustrates a noise filter 71 in accordance with a sixth preferred embodiment of the present invention. As shown, the noise filter 71 of the sixth preferred embodiment includes line conductors 73a and 73b that face each other with a magnetic body 72 interposed therebetween.

The sixth preferred embodiment of the present invention provides substantially the same advantages as the first preferred embodiment of the present invention.

In the noise filters of preferred embodiments of the present invention, cavities may be provided in the magnetic layer and the cavities may be filled with one of glass, a resin, or a composite material containing glass and a resin.

The method of manufacturing the magnetic layer will now be discussed with reference to the discussion of the first preferred embodiment of the present invention.

The magnetic body having cavities is produced by adding beads in a pre-sintered powder and the rest of the manufacturing process of the magnetic layers is the same as the first preferred embodiment. The magnetic body having the cavities therein is thus obtained. More specifically, a resin or carbon that disperses during a sintering process is used for the beads. The diameter of the beads preferably ranges from several μm to several tens of μm. The size of cavities is proportional to the diameter of the beads. The amount of the beads added determines the volume of the cavities in the magnetic body. The diameter and the amount of the beads are adjusted depending upon the volume of the glass, the resin, or the composite material of glass and resin that fills the cavities. The formation method of the cavities may be applied to the noise filter 1 illustrated in FIGS. 1 and 2, the noise filter 1 illustrated in FIGS. 9–13, the noise filter 11 illustrated in FIGS. 14 and 15, the noise filter 31 illustrated in FIGS. 16 and FIG. 17, the noise filter 31 illustrated in FIG. 18, the noise filter 31 illustrated in FIG. 20, the noise filter 51 illustrated in FIGS. 21 and 22, the noise filter 71 illustrated in FIG. 24, and the noise filter 71 illustrated in FIG. 25.

This preferred embodiment of the present invention provides substantially the same advantage as the first preferred embodiment of the present invention. In this preferred embodiment, the cavities are provided in the magnetic body made of the magnetic oxide material and are filled with the glass, the resin, or the composite material of glass and resin. The frequency at which the magnetic loss $\mu''$ increases is adjusted without changing the characteristic impedance by adjusted apparent permeability and dielectric constant.

As the permeability $\mu$ of the magnetic material is changed, the frequency at which the magnetic loss $\mu''$ increases changes. In the noise filters of preferred embodiments of the present invention, the permeability of the magnetic oxide material must be changed to change the frequency at which the magnetic loss rises. The characteristic impedance $Z_o$ of the noise filters of preferred embodiments of the present invention is expressed by $Z_o=\sqrt{(\Delta L/\Delta C)}$, and is determined by an inductance of the line conductor and a capacitance between the line conductor and the ground conductor. If the permeability of the magnetic oxide material is changed, the characteristic impedance $Z_o$ also changes.

In this preferred embodiment of the present invention, the cavities are formed in the magnetic layers, and then the cavities are filled with the glass, the resin, or the composite material of glass and resin. By adjusting the dielectric constant $\epsilon$ of the glass, the resin, or the composite material of glass and resin, a noise filter having the same characteristic impedance but a different frequency at which the magnetic loss increases is produced.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A noise filter comprising:
a laminate body including magnetic layers, dielectric layers, line conductors, and ground conductors, wherein each of the line conductors is disposed in one of a plurality of interfaces between the magnetic layers and each of the ground conductors is disposed directly between one of a plurality of interfaces between the dielectric layers such that one line conductor alternates with one ground conductor in lamination, with one ground conductor arranged on a top dielectric layer and another ground conductor arranged on a bottom dielectric layer, and the line conductors disposed between the magnetic layers being serially connected; wherein;
the magnetic layers are made of a magnetic oxide and cause little or no attenuation of an electrical signal within a frequency range below a frequency at which a magnetic loss occurs and attenuates an electrical signal within a frequency range where the magnetic loss; and
each of the ground conductors is sandwiched by and in direct contact with a respective pair of the dielectric layers.

2. A noise filter according to claim 1, wherein the frequency at which the magnetic loss of the magnetic oxide increases to above 1 is approximately equal to or greater than about 80 MHz.

3. A noise filter according to claim 1, wherein the line conductors have a meandering shape.

4. A noise filter according to claim 1, wherein the line conductors have a spiral shape.

5. A noise filter according to claim 1, wherein the line conductors are coiled around a center axis aligned in the direction of lamination of the magnetic layers.

6. A noise fitter according to claim 1, wherein the magnetic oxide is a Ni—Cu—Zn ferrite.

* * * * *